(12) United States Patent
Pombo et al.

(10) Patent No.: US 11,677,103 B2
(45) Date of Patent: Jun. 13, 2023

(54) AUXILARY BATTERY SYSTEM FOR A HEAD-MOUNTED DISPLAY

(71) Applicant: RealWear, Inc., Vancouver, WA (US)

(72) Inventors: Stephen A. Pombo, Campbell, CA (US); Sanjay Subir Jhawar, Menlo Park, CA (US); Nima Lahijani Shams, San Jose, CA (US)

(73) Assignee: RealWear, Inc., Vancouver, WA (US)

( * ) Notice: Subject to any disclaimer, the term of this patent is extended or adjusted under 35 U.S.C. 154(b) by 0 days.

(21) Appl. No.: 16/905,201

(22) Filed: Jun. 18, 2020

(65) Prior Publication Data

US 2020/0400947 A1 Dec. 24, 2020

Related U.S. Application Data

(60) Provisional application No. 62/864,790, filed on Jun. 21, 2019.

(51) Int. Cl.
  H01M 10/44 (2006.01)
  H01M 10/42 (2006.01)
  (Continued)

(52) U.S. Cl.
  CPC .......... H01M 10/44 (2013.01); G01R 31/382 (2019.01); G02B 27/017 (2013.01);
  (Continued)

(58) Field of Classification Search
  CPC .... H01M 2/30; H01M 2/1022; H01M 2/0202; H01M 10/425; H01M 10/44;
  (Continued)

(56) References Cited

U.S. PATENT DOCUMENTS 5,880,773 A 3/1999 Suzuki
6,424,321 B1 7/2002 Ronzani et al.
(Continued)

OTHER PUBLICATIONS

Non-Final Office Action dated Oct. 14, 2021 in U.S. Appl. No. 16/908,501, 20 pages.
(Continued)

*Primary Examiner* — Yaron Cohen
(74) *Attorney, Agent, or Firm* — Shook, Hardy & Bacon L.L.P.

(57) ABSTRACT

A battery system for a head-mounted display is provided. A first arm member has one or more interior walls defining a first chamber, wherein one or more first batteries are positioned in the first chamber of the first arm member. A second arm member has one or more interior walls defining a second chamber, wherein one or more second batteries are positioned in the second chamber of the second arm member. A base member is coupled to the first arm member and the second arm member. The base member has a base member power connector positioned along an exterior surface. A first auxiliary battery removably couples to the exterior surface of the base member via a first fastener, the first auxiliary battery having a first side and a second side. A first auxiliary battery power connector is positioned on the first side and aligns with the base member power connector.

20 Claims, 26 Drawing Sheets

(51) Int. Cl.
| | |
|---|---|
| *G02B 27/01* | (2006.01) |
| *G01R 31/382* | (2019.01) |
| *H02J 7/00* | (2006.01) |
| *G06F 1/16* | (2006.01) |
| *H01M 10/04* | (2006.01) |
| *H01M 50/204* | (2021.01) |
| *H01M 50/567* | (2021.01) |
| *H01M 50/566* | (2021.01) |

(52) U.S. Cl.
CPC ......... *G02B 27/0176* (2013.01); *G06F 1/163* (2013.01); *H01M 10/0436* (2013.01); *H01M 10/425* (2013.01); *H01M 50/204* (2021.01); *H02J 7/0047* (2013.01); *H01M 50/566* (2021.01); *H01M 50/567* (2021.01); *H02J 7/0014* (2013.01)

(58) Field of Classification Search
CPC .. H01M 50/10; H01M 50/256; H01M 50/207; H01M 10/0436; H01M 50/247; H01M 50/543; H01M 50/20; H01M 2220/30; H02J 7/0042; H02J 7/0047; H02J 7/0014; G01R 31/382; G02B 27/017; G02B 27/0176; G02B 2027/0138; G02B 2027/0181; G02B 2027/0154; G06F 1/163; G06F 3/011; G06F 1/1635; G06F 1/1632; Y02E 60/10; Y02P 70/50
See application file for complete search history.

(56) References Cited

U.S. PATENT DOCUMENTS

| | | | |
|---|---|---|---|
| 8,605,008 | B1 | 12/2013 | Prest et al. |
| 8,777,406 | B2 | 7/2014 | Sugihara et al. |
| 9,841,603 | B2 | 12/2017 | Halpin et al. |
| 9,844,144 | B1 | 12/2017 | Al-Momani et al. |
| 2006/0109350 | A1 | 5/2006 | Yeh |
| 2006/0119539 | A1 | 6/2006 | Kato et al. |
| 2007/0030442 | A1 | 2/2007 | Howell et al. |
| 2009/0097688 | A1 | 4/2009 | Lewis |
| 2011/0089207 | A1 | 4/2011 | Tricoukes et al. |
| 2011/0213664 | A1 | 9/2011 | Osterhout et al. |
| 2012/0235896 | A1 | 9/2012 | Jacobsen et al. |
| 2012/0293407 | A1 | 11/2012 | Lee |
| 2013/0002559 | A1 | 1/2013 | Vardi |
| 2013/0090062 | A1 | 4/2013 | Tricoukes et al. |
| 2013/0176626 | A1 | 7/2013 | Heinrich et al. |
| 2013/0182396 | A1 | 7/2013 | Hu |
| 2014/0244854 | A1 | 8/2014 | Patel et al. |
| 2016/0178903 | A1 | 6/2016 | Nakajima |
| 2016/0246059 | A1 | 8/2016 | Halpin et al. |
| 2016/0274662 | A1 | 9/2016 | Rimon et al. |
| 2017/0227774 | A1* | 8/2017 | Cherdakov ........ H04N 21/4223 |
| 2017/0264987 | A1 | 9/2017 | Hong et al. |
| 2017/0317490 | A1* | 11/2017 | Penny .................. G02B 27/017 |
| 2018/0124497 | A1 | 5/2018 | Boesen |
| 2019/0075254 | A1 | 3/2019 | Jhawar et al. |
| 2019/0094981 | A1 | 3/2019 | Bradski et al. |
| 2019/0332566 | A1 | 10/2019 | Yasunaka et al. |
| 2020/0026349 | A1 | 1/2020 | Fontanel et al. |
| 2020/0183190 | A1 | 6/2020 | Rousseau et al. |

OTHER PUBLICATIONS

International Preliminary Report on Patentability received for PCT Application No. PCT/US2020/039004, dated Dec. 30, 2021, 7 pages.
International Preliminary Report on Patentability received for PCT Application No. PCT/US2020/038625, dated Dec. 30, 2021, 11 pages.
Non-Final Office Action dated May 16, 2022 in U.S. Appl. No. 16/908,501, 23 pages.
First Action Interview Office Action dated May 18, 2022 in U.S. Appl. No. 16/905,227, 3 pages.
Notice of Allowance dated Jun. 23, 2022 in U.S. Appl. No. 16/905,127, 9 pages.
Piccardi, L., et al., "WearCam: A head mounted wireless camera for monitoring gaze attention and for the diagnosis of developmental disorders in young children", 16th IEEE International Conference on Robot & Human Interactive communication, pp. 594-598 (Aug. 2007).
International Search Report and Written Opinion received for PCT Patent Application No. PCT/US2020/038625, dated Sep. 4, 2020, 11 pages.
International Search Report and Written Opinion received for PCT Patent Application No. PCT/US2020/039004, dated Oct. 9, 2020, 9 pages.
Final Office Action dated Feb. 9, 2022 in U.S. Appl. No. 16/908,501, 23 pages.
Preinterview first Office Action dated Mar. 10, 2022 in U.S. Appl. No. 16/905,227, 4 pages.
Final Office Action dated Aug. 29, 2022 in U.S. Appl. No. 16/908,501, 18 pages.
Notice of Allowance dated Oct. 5, 2022 in U.S. Appl. No. 16/905,227, 11 pages.
Notice of Allowance dated Feb. 7, 2023 in U.S. Appl. No. 16/908,501, 10 pages.

* cited by examiner

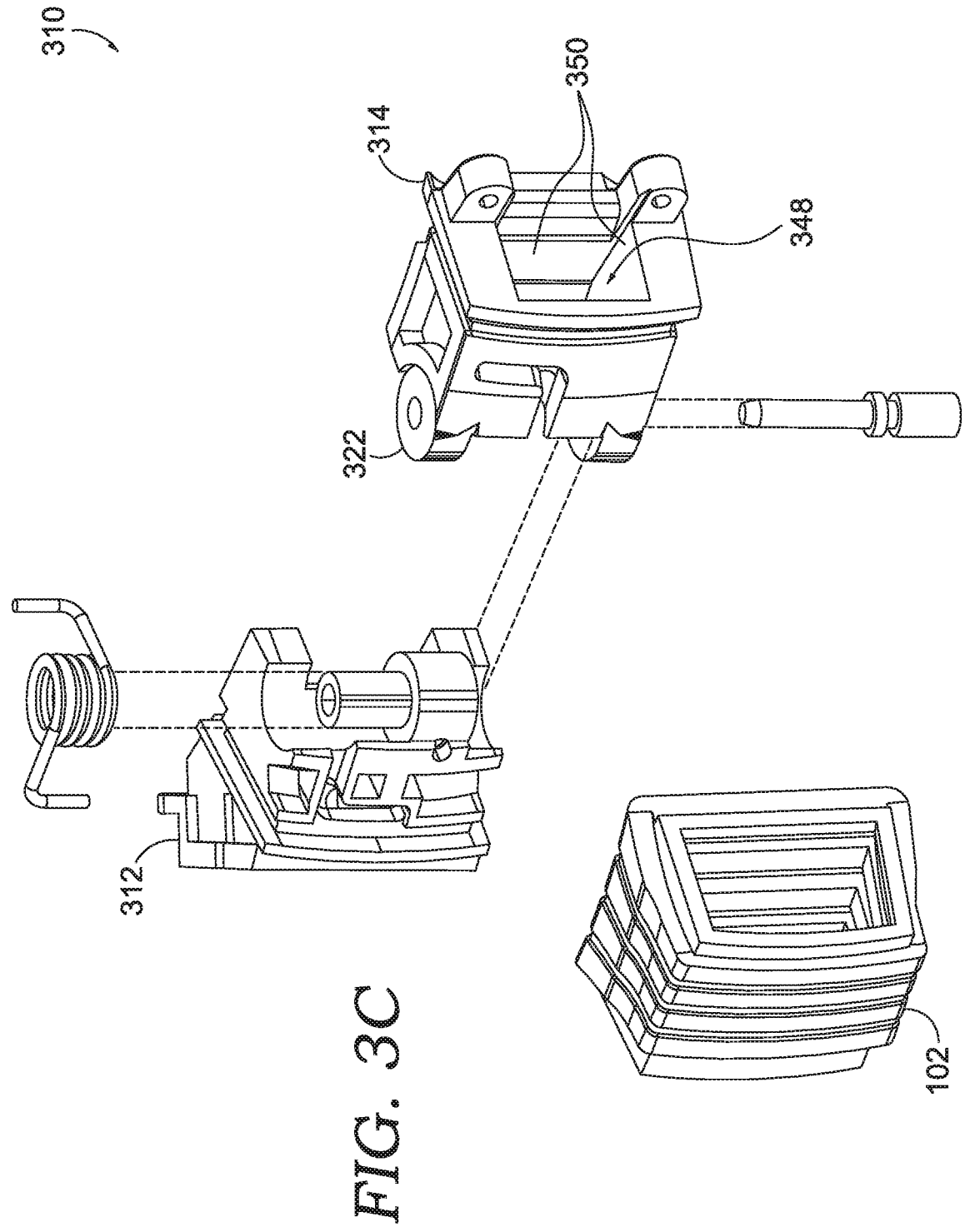

AUXILARY BATTERY SYSTEM FOR A HEAD-MOUNTED DISPLAY

CROSS REFERENCE TO RELATED APPLICATIONS

This application claims the benefit of U.S. Provisional Application No. 62/864,790, filed Jun. 21, 2019, entitled "Head-Mounted Computing Device and Modular Peripherals for Head-Mounted Computing Device," which is incorporated by reference herein in its entirety.

BACKGROUND

Head-mounted displays are sometimes used to mount technology on or around a user's head, allowing the user to transport and use different technologies with greater ease and flexibility. Head-mounted displays generally utilize a head-wearable frame system to support a display component. In certain circumstances, these head-wearable frame systems often have high demands for power and, thus, cannot be used for extended periods of time.

SUMMARY

This summary is intended to introduce a selection of concepts in a simplified form that are further described below in the detailed description section of this disclosure. This summary is not intended to identify key or essential features of the claimed subject matter, nor is it intended to be used as an aid in determining the scope of the claimed subject matter.

In brief, and at a high level, this disclosure describes, among other things, a head-mounted display system having an auxiliary battery system. The head-mounted display system may include a base member that is coupled to one or more arm members. An auxiliary battery may be mounted to the head-mounted display system to increase a power capacity of the head-mounted display system. As head-mounted display systems typically draw a large amount of power, the auxiliary battery allows the head-mounted display system to be worn for longer periods of time. The auxiliary battery may be mechanically coupled to the base member via one or more fasteners. Coupling the auxiliary battery to the base member secures the auxiliary battery to the head-mounted display system, preventing the auxiliary battery from becoming dislodged as the user moves or jostles his head.

The auxiliary battery may also electrically couple to the base member. For example, the auxiliary battery and the base member may have corresponding power interfaces that electrically couple the auxiliary battery to the base member. Utilizing corresponding power interfaces eliminates a need for exposed wiring that can accidentally be pulled or snagged, thereby disconnecting the auxiliary battery from the head-mounted display system.

To provide an even greater power capacity, multiple auxiliary batteries may be mounted to each other in a "stackable" manner. For instance, a first side of a first auxiliary battery may be mounted to the base member. A second auxiliary battery may then be mounted to a second side of the first auxiliary battery. Mounting multiple auxiliary batteries allows a user to wear the head-mounted display system for extended periods of time since the auxiliary batteries satisfy the demanding electrical loads created by the electrical components of the head-mounted display system (e.g., image sensors, displays, wireless communication devices, and the like).

In one embodiment of the present technology, a battery system for a head-mounted display system is provided. A first arm member has one or more interior walls defining a first chamber, wherein one or more first batteries are positioned in the first chamber of the first arm member. A second arm member has one or more interior walls defining a second chamber, wherein one or more second batteries are positioned in the second chamber of the second arm member. A base member is coupled to the first arm member and the second arm member. The base member has a base member power connector positioned along an exterior surface. A first auxiliary battery removably couples to the exterior surface of the base member via a first fastener, the first auxiliary battery having a first side and a second side. A first auxiliary battery power connector is positioned on the first side and aligns with the base member power connector.

In another embodiment of the present technology, a battery system for a head-mounted display system is provided. One or more arm members having one or more interior walls defining a first chamber and a second chamber. One or more batteries are positioned in the first chamber and the second chamber. A base member that couples to the one or more arm members, the base member having a base member power connector on an exterior surface. A first auxiliary battery has a first side and a second side. A first fastener that removably couples the first side of the auxiliary battery to the exterior surface of the base member. A first auxiliary battery power connector on the first side of the first auxiliary battery, the first auxiliary battery power connector electrically coupling to the base member power connector, and wherein the first fastener is offset from the first auxiliary battery power connector and the base member power connector.

In a further embodiment of the present technology, a method of manufacturing an auxiliary battery for a head-mounted display system is provided. The method includes positioning one or more fasteners on a first auxiliary battery that removably couples to an exterior surface of a base member, the first auxiliary battery having a first side and a second side. The method includes positioning one or more guiding mechanisms on the first side of the auxiliary battery, the one or more guiding mechanisms aligning with one or more guiding mechanisms of the base member. The method includes positioning a first auxiliary battery power connector on the first side of the first auxiliary battery, the first auxiliary battery power connector aligning with a base member power connector. The method includes positioning a second auxiliary battery power connector on the second side of the first auxiliary battery, the second auxiliary battery power connector aligning with a third power connector of a second auxiliary battery.

In one embodiment of the present technology, a head-mounted display system is provided. A base member extends from a first end to a second end, the base member having one or more interior walls that define one or more chambers within the base member. A first arm member is coupled to the first end of the base member at a proximal end, the first arm member having one or more interior walls defining a first chamber, the first chamber having a first opening at the proximal end of the first arm member. A second arm member is coupled to the second end of the base member, the second member spaced apart from the first arm member to form an opening therebetween so as to be worn on a wearer's head, the second arm member having one or more interior walls defining a second chamber, the second chamber having a second opening at the proximal end of the second arm member. One or more hinges are positioned at the proximal end of the first arm member and the second arm member, allowing a distal end of the first arm member and a distal end of the second arm member to move with respect to one another. One or more first batteries are positioned in the first chamber of the first arm member. One or more second batteries positioned in the second chamber of the second arm member. A battery monitor is positioned in the one or more chambers of the base member and between the first battery and the second battery, wherein the battery monitor monitors a charge of the one or more first batteries and the one or more second batteries, the battery monitor electrically coupled to the one or more first batteries via a first wiring extending through the first opening, the battery monitor further electrically coupled to the one or more second batteries via a second wiring extending through the second opening.

In another embodiment of the present technology, a head-mounted display system is provided. A base member extends from a first end to a second end, the base member having one or more interior walls that define one or more chambers within the base member. A first arm member has a distal end and a proximal end, the distal end coupled to a head-mounted display, the proximal end coupled to the first end of the base member, the first arm member having one or more interior walls that define a first chamber within the first arm member. A second arm member has a distal end and a proximal end, the distal end coupled to an image sensor, the proximal end coupled to the second end of the base member, the second arm member having one or more interior walls that define a second chamber within the second arm member. One or more first batteries are positioned in the first chamber of the first arm member. One or more second batteries are positioned in the second chamber of the second arm member. A battery monitor is positioned within the one or more chambers of the base member and between the one or more first batteries and the one or more second batteries, wherein the battery monitor monitors a charge of the one or more first batteries and the one or more second batteries, the battery monitor electrically coupled to the one or more first batteries via a first wiring extending through the first chamber of the first arm member, the battery monitor further electrically coupled to the one or more second batteries via a second wiring extending through the second chamber of the second arm member.

In a further embodiment of the present technology, a method of manufacturing a head-mounted display system is provided. The method includes providing a base member having a first end and a second end, the base member having one or more interior walls that define one or more chambers within the base member. The method also includes providing a first arm member to be coupled to the first end of the base member at a proximal end, the first arm member having one or more interior walls defining a first chamber, the first chamber having a first opening at the proximal end of the first arm member. The method further includes providing a second arm member to be coupled to the second end of the base member, the second member spaced apart from the first arm member to form an opening therebetween so as to be worn on a wearer's head, the second arm member having one or more interior walls defining a second chamber, the second chamber having a second opening at the proximal end of the second arm member. The first arm member and the second arm member are coupled to the base member via one or more hinges positioned at the proximal end of the first arm member and the second arm member, the one or more hinges allowing a distal end of the first arm member and a distal end of the second arm member to move with respect to one another, wherein one or more first batteries are positioned in the first chamber of the first arm member, and wherein one or more second batteries are positioned in the second chamber of the second arm member. The method includes providing a battery monitor within the one or more chambers of the base member, wherein the battery monitor monitors a charge of the one or more first batteries and the one or more second batteries, the battery monitor electrically coupled to the one or more first batteries via a first wiring extending through the first opening and through the one or more hinges, the battery monitor further electrically coupled to the one or more second batteries via a second wiring extending through the second opening and through the one or more hinges.

In one embodiment of the present technology, a head-mounted display system is provided. The head-mounted display system comprises an arm member having a distal end and a proximal end. A display portion is coupled to the distal end of the arm member. A base member is pivotally coupled to the proximal end of the arm member by a hinge. The hinge comprises a first hinge member that mates with a second hinge member, the first hinge member having an interior wall structure defining a first passage extending therethrough, and the second hinge member having an interior wall structure defining a second passage extending therethrough, the second passage opening to the first passage. The head-mounted display system further comprises a biasing member for biasing the hinge to a first position.

In another embodiment of the present technology, a frame for a head-mounted display is provided. The frame comprises a base member including a first end and a second end. The frame also comprises a first arm member including a proximal end that is pivotally coupled to the first end of the base member. The frame further comprises a second arm member including a proximal end that is pivotally coupled to the second end of the base member. The frame additionally comprises a pair of hinges pivotally coupling the first arm member and the second arm member to the base member, each of the pair of hinges comprising a first hinge member that mates with a second hinge member. The first hinge member has an interior wall structure defining a first passage extending therethrough. The second hinge member has an interior wall structure defining a second passage extending therethrough, the second passage opening to the first passage. The frame further comprises a pair of biasing members for biasing the pair of hinges to a first position.

In a further embodiment of the present technology, a hinge for a head-mounted display frame is provided. The hinge comprises a first hinge member having a first pin housing. The hinge also comprises a second hinge member having a second pin housing, wherein the second pin housing mates with the first pin housing, the first pin housing and the second pin housing are configured to receive a pin. The first hinge member has an interior wall structure defining a first passage extending therethrough. The second hinge member has an interior wall structure defining a second passage extending therethrough, the second passage opening to the first passage. The hinge further comprising a biasing member for biasing the hinge to a first position.

BRIEF DESCRIPTION OF THE DRAWINGS

The present technology is described in detail herein with reference to the attached figures, which are exemplary and non-limiting in nature, wherein:

FIG. 3C is a third exploded view of the hinge system for the head-mounted display system of FIG. 3A, in accordance with an embodiment of the present technology;

DETAILED DESCRIPTION

Figure 1A:
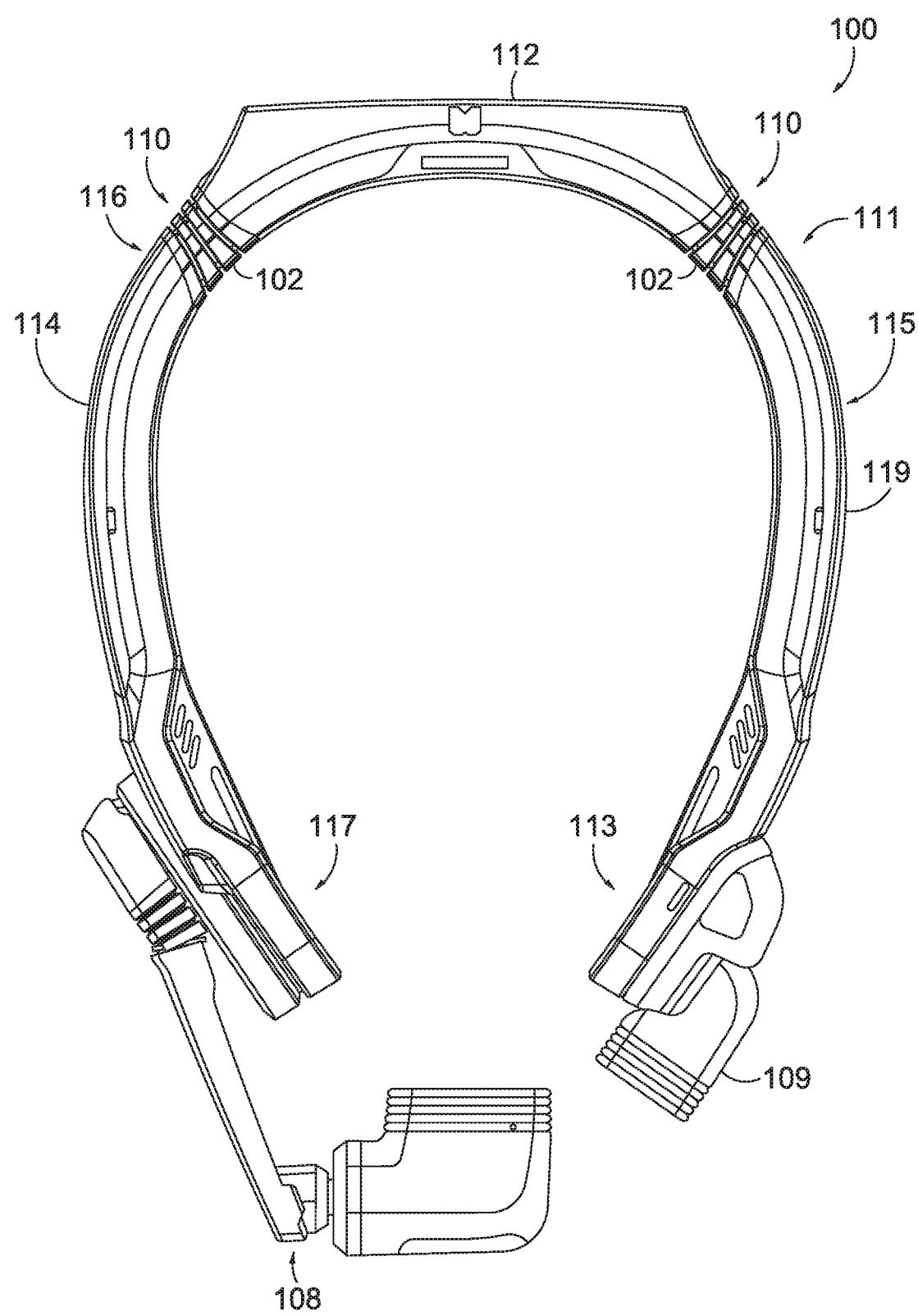
FIG. 1A is a top, plan view of an exemplary head-mounted display system, in accordance with an embodiment of the present technology.

The subject matter of the present technology is described with specificity in this disclosure to meet statutory requirements. However, this description is not intended to limit the scope hereof. Rather, the claimed subject matter may be embodied in other ways, to include different steps, combinations of steps, features, and/or combinations of features, similar to the ones described in this disclosure, in conjunction with other present or future technologies. Moreover, although the terms "step" and "block" may be used to identify different elements of methods employed, the terms should not be interpreted as implying any particular order among or between various steps or blocks unless and except when the order of individual steps or blocks is explicitly described and required.

In brief, and at a high level, this disclosure describes, among other things, a head-mounted display system having an auxiliary battery system. The head-mounted display system may also include an internal battery system. For example, a base member is coupled to one or more arm members. The one or more arm members provide a chamber to house one or more batteries within the head-mounted display system. One or more first batteries may be positioned within a chamber in a first arm member and one or more second batteries may be positioned within a chamber in a second arm member.

As for the auxiliary battery system, an auxiliary battery may be mounted to the head-mounted display system. For instance, one or more auxiliary batteries may be mechanically coupled to the base member via one or more fasteners. Mounting the auxiliary battery to the base member secures the auxiliary battery to the head-mounted display system, preventing the auxiliary battery from becoming dislodged as the user moves or jostles his head. The auxiliary battery may also electrically couple to the base member. For example, the auxiliary battery and the base member may have corresponding power interfaces that electrically couple the auxiliary battery to the base member. By utilizing corresponding power interfaces, it eliminates a need for exposed wiring that may accidentally be pulled or snagged, thereby disconnecting the auxiliary battery from the head-mounted display system.

One or more guiding components may be used to facilitate mounting the auxiliary battery. For example, the one or more guiding components may allow the user to wear the head-worn display system while attaching the auxiliary battery. Additionally, the one or more guiding components may prevent the power interface, such as one or more pins, from becoming damaged if the auxiliary battery is struck or accidentally dropped. The one or more guiding components in combination with the fasteners may thus further secure the auxiliary battery to the head-mounted display system and ensure that the electrical connection is not disrupted.

To provide an even greater power capacity, multiple auxiliary batteries may be mounted to each other in a "stackable" manner. For instance, a first auxiliary battery may be mounted to the base member at one side. A second auxiliary battery may be mounted to another side of the first auxiliary battery. Mounting auxiliary batteries (and sometimes multiple auxiliary batteries) to the head-mounted display system allows a user to wear the head-mounted display system for extended periods of time since the auxiliary batteries satisfy demanding electrical loads created by electrical components (e.g., image sensors, displays, wireless communication devices, and the like).

Turning initially to FIG. 1A, a top, plan view of an exemplary head-mounted display system 100 is shown, in accordance with an embodiment of the present technology. The head-mounted display system 100 includes a base member 112 and one or more arm members 115, such as a first arm member 114 and a second arm member 119. First arm member 114 includes a first end 116 (also referred to as a proximal end) and a second end 117 (also referred to as a distal end). The first end 116 may be located proximate the base member 112. Second arm member 119 includes a first end 111 (also referred to as a proximal end) and a second end 113 (also referred to as a distal end). The first end 111 may be located proximate the base member 112. The one or more arm members 115 may extend away from the base member 112 and to the second ends 117 and 113.

In some aspects, the one or more arm members 115 and the base member 112 are modular components that may be coupled together. For instance, the first end 116 of the first arm member 115 may be coupled (and/or removable coupled) to the base member 112. Additionally or alternatively, the first end 111 of the second arm member 119 may be coupled (and/or removable coupled) to the base member 112. The modularity of the one or more arm members 115 and the base member 112 allows the arm members 115 and base member 112 to be manufactured separately. As such, the arm members 115 and base member 112 may be manufactured in different locations or at different times. Additionally, in the event that any of the modular components of the head-mounted display system 100 are damaged, the damaged component can be swapped out for a new component without replacing the entire head-mounted display system 100. It should be appreciated that each member itself (e.g., one or more arm members 115 and the base member 112) may be a single, integral component (e.g., formed through a molding process) or formed by multiple components that are coupled to each other to form the member.

The head-mounted display system 100 includes a display module 108. The display module 108 may be coupled to the second end 117 of the first arm member 114. As used in this disclosure, the term "display module" includes any component used with a head-mounted display that is configured to provide a display characteristic that is viewable to a user. A "display characteristic" includes any viewable characteristic, such as a display state (e.g., transparent, partially transparent, non-transparent, selectively transparent, interactive, text/image/video presenting, etc.), a display type (e.g., an optic, waveguide optic, digital display, micro display (e.g., a liquid crystal display (LCD), light-emitting diode (LED) display, organic light-emitting diode (OLED) display, digital light processing (DLP) display, etc.), or any combination thereof, etc.), a display configuration (e.g., one or multiple display portions of the same or different type, display portions at different angles, display portions in different arrangements, etc.), and/or technical specifications of the display portion (e.g., resolution, pixels per inch, size, parallax, contrast, color depth, refresh rate, etc.), in addition to other display characteristics. The preceding examples are intended to be exemplary and non-limiting.

The head-mounted display system 100 also includes one or more cameras 109. For instance, the one or more cameras 109 may be coupled to the second end 113 of the second arm member 119. By way of example, the one or more cameras 109 may be any image sensor capable of capturing an image data, such as a video camera or a depth camera, including stereoscopic camera systems, infrared camera systems, or RGB camera systems.

Figure 1B:
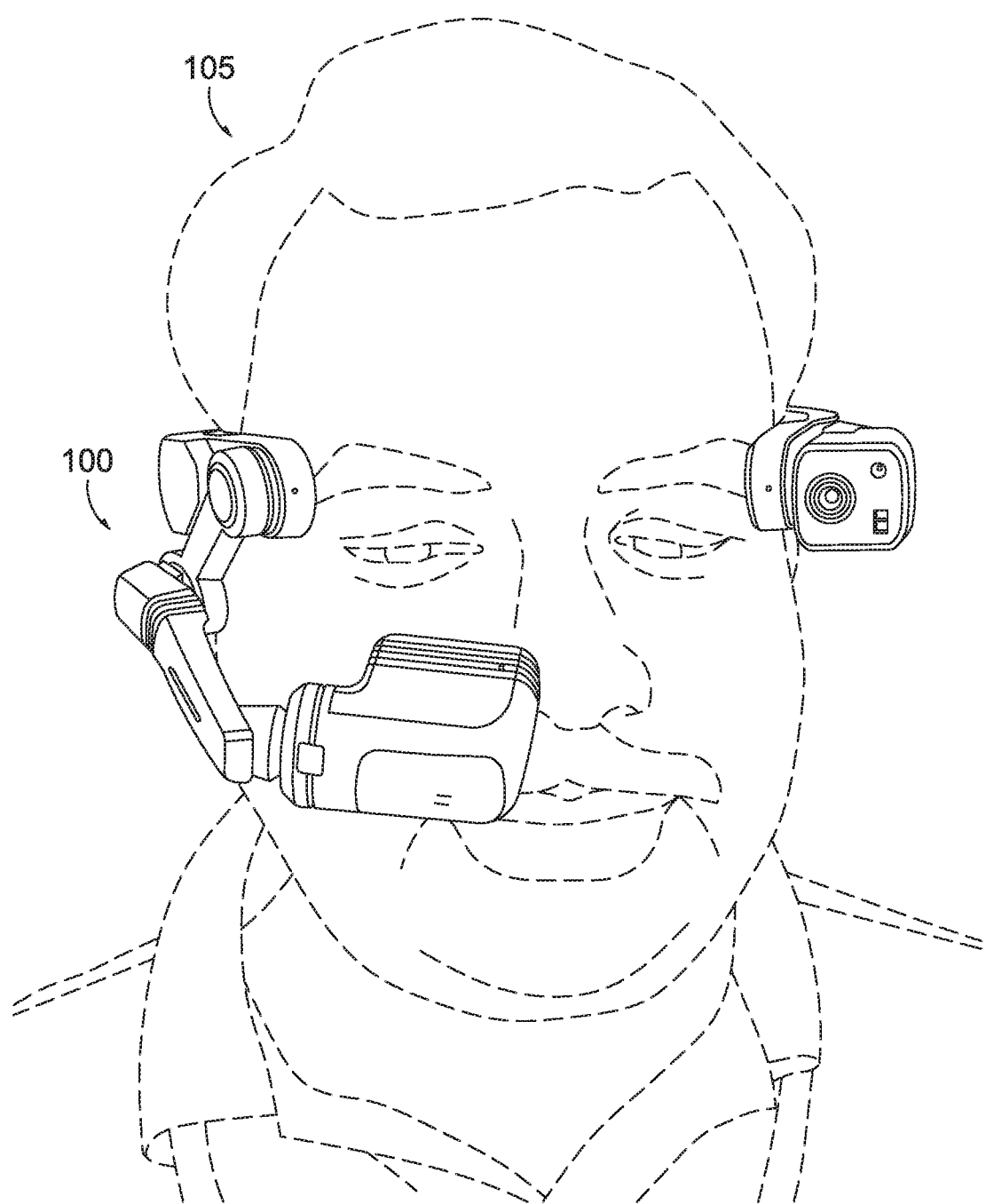
FIG. 1B illustrates an exemplary head-mounted display system worn by a user, in accordance with an embodiment of the present technology.

FIG. 1B illustrates a person 105 wearing the head-mounted display system 100. The head-mounted display system 100 may be configured to be worn on a user's head such that the display module 108 is positioned proximate to a user's eye. By way of example, in an as-worn configuration (i.e., when the head-mounted display system 100 is worn by the user 105), the base member 112 may be located proximate to the back of a user's head while the one or more arm members 115 may be located along the side of the user's head, adjacent the user's ears. It is contemplated that the head-mounted display system 100 may have different orientations or components and, thus, be worn differently.

It should be appreciated that the head-mounted display system 100 may be worn directly on the user's head or, alternatively, may be worn indirectly based on the head-mounted display system 100 being attached to a user's helmet or hat, or similar head-worn apparel. While not shown, the head-mounted display system 100 may be coupled to a head-worn apparel via one or more attachment mechanisms, such as clips, straps, buckles, and the like.

Returning to FIG. 1A, the head-mounted display system 100 includes one or more hinges 110. The one or more hinges 110 may couple the one or more arm members 115 to the base member 112. The one or more hinges 110 include a hinge cover 102. As discussed in greater detail herein, the hinge cover 102 may be configured to fit over the one or more hinges 110 to prevent external elements (e.g., dust or moisture) from entering the head-mounted display system.

In general, the hinge 110 couples the first end 116 of the first arm member 114 to the base member 112. As better illustrated in FIG. 2A, the one or more hinges 110 allow the one or more arm members 115 to move with respect to one another or move with respect to the base member 112. For instance, the one or more hinges allow the one or more arm members 115 to move from a first position 120 to a second position 122. In some aspects, in the second position 122, the second ends 117 and 113 of the one or more arm members 115 are closer together as compared to the first position 120. While not shown, the one or more hinges 110 may allow the one or more arm members 115 to contact each other. It should be appreciated that allowing the one or more arm members 115 to contact one another may improve the overall impact resistance of the frame as the impact force can be dampened or distributed.

The one or more hinges 110 may also allow the one or more arm members 115 to move to a third position 124. In the third position 124, the second ends of the one or more arm members 115 are moved further away from each other as compared to the first position 120. As described in greater detail below, the head-mounted display system 100 may be biased toward the first position 120.

Figure 2A:
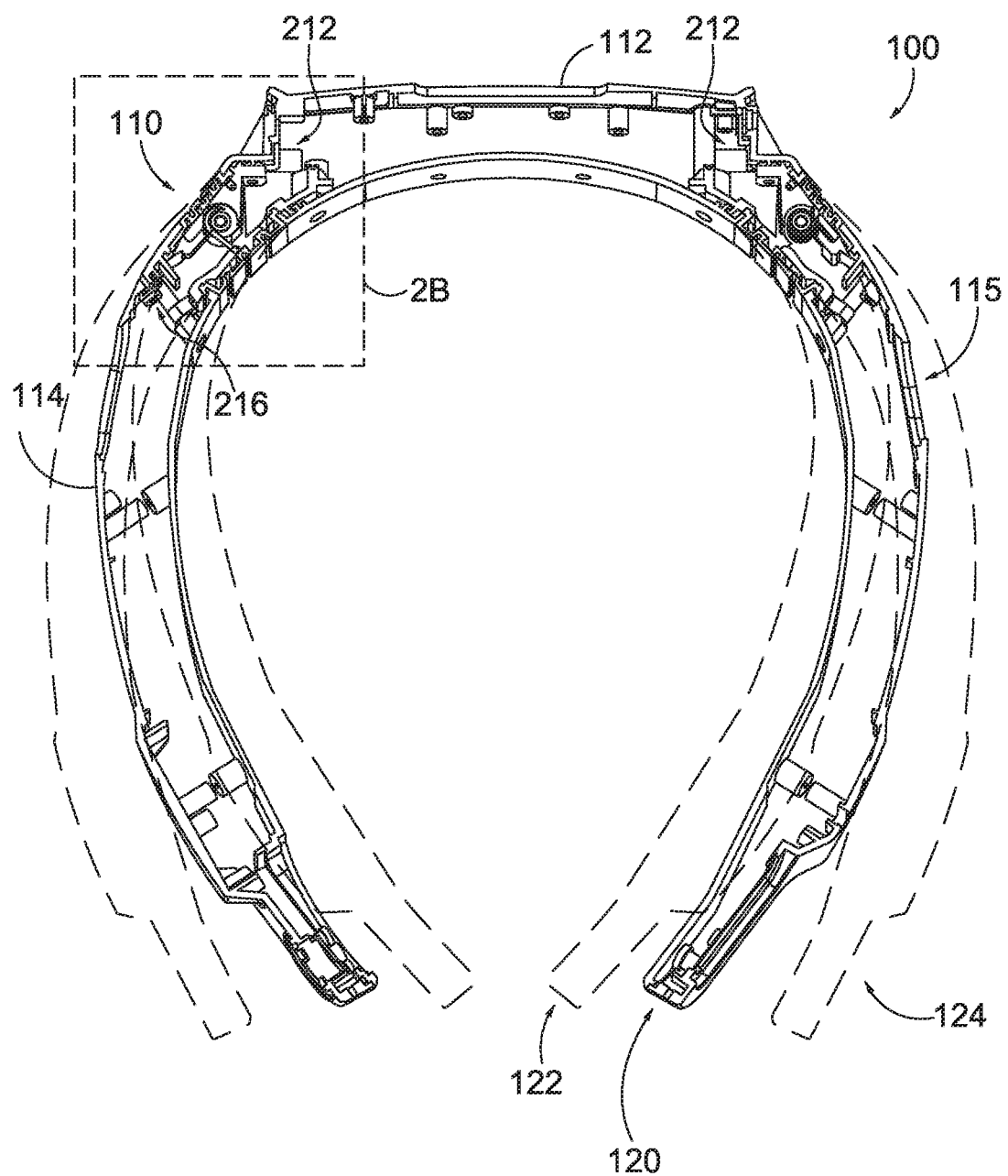
FIG. 2A is a cross-sectional, perspective view with portions removed to show an internal portion of the head-mounted display system of FIGS. 1A-B, in accordance with an embodiment of the present technology.

FIG. 2A is a cross-sectional, perspective view of an internal portion of the head-mounted display system 100 of FIG. 1A, in accordance with an embodiment of the present technology. As illustrated, the base member 112 includes one or more base chambers 212. While not shown, the one or more base chambers 212 may house various electronic components. The one or more arm members 115 may also include one or more chambers. For instance, the first arm member 114 includes an arm chamber 216. As described in more detail below, the hinge 110 may provide interior wall portions that provide a passage that is in communication with the one or more base chambers 212 and the arm chamber 216. It should be appreciated that the passage through the hinge is maintained while the head-mounted display system 100 is in the first position 120, second position 122, and third position 124 to allow wiring to pass through the hinge.

Figure 2B:
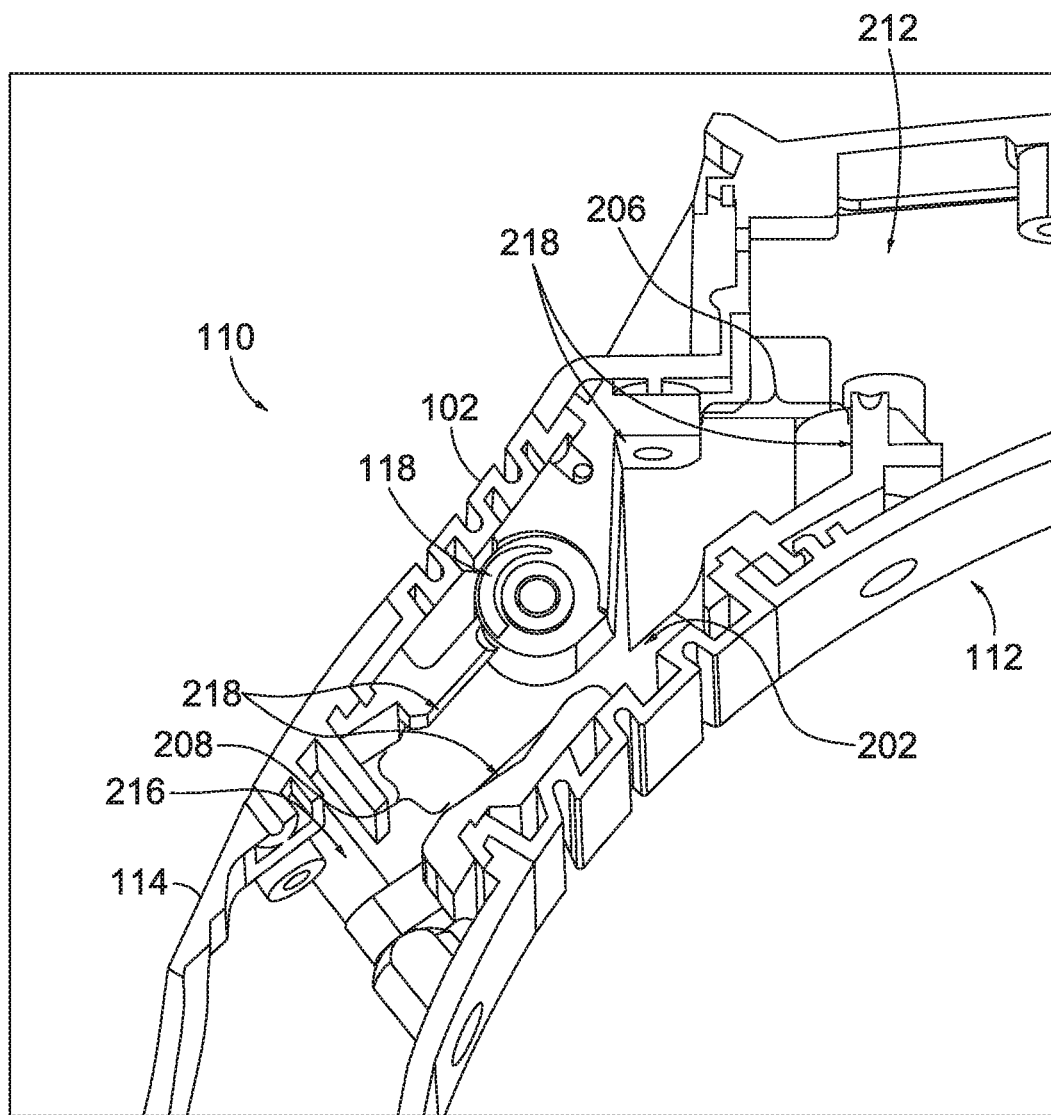
FIG. 2B is an enlarged view of area 2B in FIG. 2A, showing an enlarged view of the internal portion of the head-mounted display system of FIG. 2A, in accordance with an embodiment of the present technology.

FIG. 2B is an enlarged view of the internal portion of the hinge 110 of the head-mounted display system 100 of FIG. 1A, in accordance with an embodiment of the present technology. As mentioned, the hinge 110 may pivotally couple the base member 112 to the first arm member 114 while still providing a passage 202 through the hinge 110, thereby allowing wires to pass through the hinge 110. The passage 202 may be formed by interior walls 218 of the hinge 110. The interior walls 218 may be curved, straight, smooth, angled, or rounded so long as they form a passage within the interior portion of the hinge 110. As depicted, the passage 202 through the hinge 110 may open into the one or more base chambers 212 of the base member 112 via a first opening 206. The first opening 206 may be formed by an interior wall of the hinge 110 that opens toward the base member 112. Similarly, the passage 202 through the hinge 110 may open into the arm chamber 216 via a second opening 208. The second opening 208 may be formed by an interior wall of the hinge 110 that opens toward the first arm member 114.

The hinge 110 may be a modular component that is formed separately from the head-mounted display system 100. As such, in some aspects, the hinge 110 may be coupled to the base member 112 or the one or more arm members 115 via one or more attachment mechanisms. By way of example the one or more attachment mechanisms may be one or more of screw-based elements, male-female connectors, adhesives, straps, clips, elastically deformable elements, buttons, hooks, or hook-and-loop fasteners. Alternatively, the hinge 110 may be integral to the head-mounted display system 100, such as through integrally forming the hinge 110 with the one or more arm members 115 and/or base member 112 (e.g., through a molding process).

In some aspects, the hinge 110 comprises a biasing member 118. The biasing member 118 may be any mechanism or tensioning element for biasing the hinge toward a particular position. In some aspects, the biasing member 118 may be a torsional spring. Referring to FIG. 2A, for example, the biasing member 118 may bias the one or more arm members 115 toward the first position 120 after being displaced to the second position 122. Likewise, the biasing member 118 may bias the one or more arm members 115 toward the first position 120 after being displaced to the third position 124. The interior walls 218 may be located such that the passage 202 through the hinge 110 is maintained despite the hinge 110 being in the first position 120, second position 122, or third position 124.

While described in further detail below, the hinge system may further comprise a hinge cover 102. The hinge cover 102 generally fits over the hinge 110 so as to surround at least a portion of the hinge 110. The hinge cover 102 may be a flexible member that expands and contracts as the one or more arm members 115 move with respect to the base member 112. In some aspects, the hinge cover 102 prevents external elements (e.g., dust or moisture) from entering the interior portions of the hinge 110 (e.g., the passage 202, arm chamber 216, or one or more base chambers 212). In some aspects, the hinge cover 102 may comprise one or more walls forming a top-side face, bottom-side face, front-side face, and rear-side face of the hinge 110. The walls of the hinge cover 102 may form openings at the ends of the cover, such as where the hinge 110 couples to the base member 112 or one or more arm members 115, as explained in greater detail below.

Figure 3A:
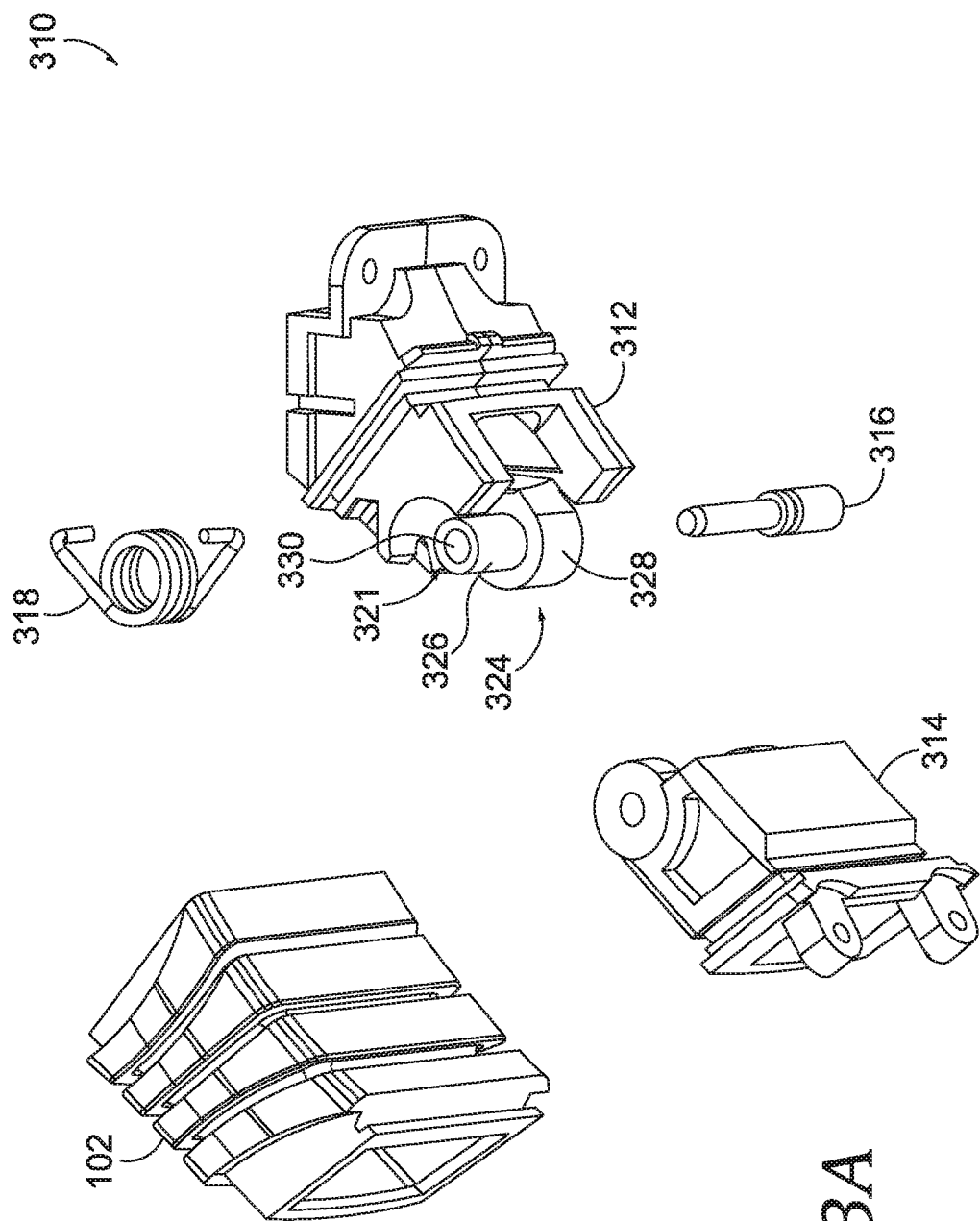
FIG. 3A is a first perspective of an exploded view of the hinge system for the head-mounted display system, in accordance with embodiments of the present technology.
Figure 3B:
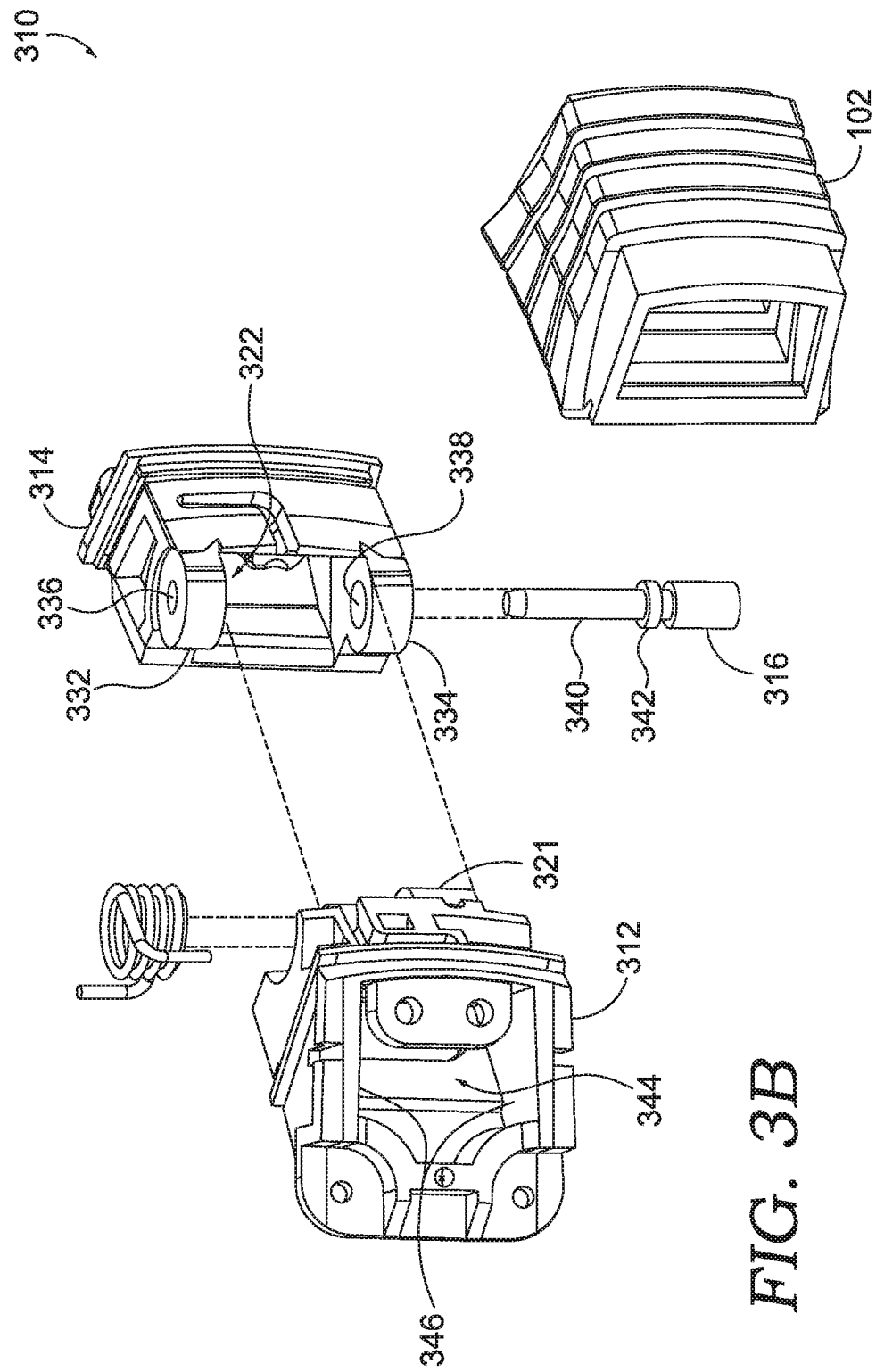
FIG. 3B is a second perspective of an exploded view of the hinge system for the head-mounted display system of FIG. 3A, in accordance with an embodiment of the present technology.

FIGS. 3A-C are exploded views of a hinge system 310 taken from alternative perspectives, in accordance with embodiments of the present technology. Referring to FIG. 3A, the hinge system 310 includes a first hinge member 312 that mates with a second hinge member 314. In some aspects, the first hinge member 312 may couple to a base member, such as the base member 112, via an attachment mechanism. Additionally, the second hinge member 314 may couple to an arm member, such as the first arm member 114, via an attachment mechanism. The hinge system 310 may further include the hinge cover 102 that fits over the first hinge member 312 and the second hinge member 314.

The first hinge member 312 may include a first pin housing 321. The first pin housing 321 includes a protrusion 324 having a bore 330 extending therethrough that receives a pin 316. The protrusion 324 may comprise a first portion 326 and a second portion 328. In some aspects, the first portion 326 and the second portion 328 have different dimensions (e.g., width or diameter). In some aspects, a biasing member 318 fits over at least one of the first portion 326 or second portion 328. For instance, the first portion 326 may comprise a smaller outer surface dimension (e.g., width or diameter) with respect to the outer surface dimension (e.g., width or diameter) of the second portion 328. The biasing member 318 (such as a torsional spring) may be received over the first portion 326 of the protrusion 324 and fit adjacent to the second portion 328.

Referring to FIG. 3B, the second hinge member 314 may comprise a second pin housing 322. The second pin housing 322 includes one or more tabs, such as a first tab 332 and a second tab 334. The first tab 332 may be spaced apart from the second tab 334 to form an opening therebetween. In some aspects, the first pin housing 321 is received between the opening between the first tab 332 and the second tab 334. The one or more tabs (332, 334) may include a bore extending therethrough (e.g., a first bore 336 and a second bore 338) that receives the pin 316. When the first hinge member 312 and second hinge member 314 are mated, the pin 316 may extend through the first pin housing 321 and the second pin housing 322.

The pin 316 includes a first portion 340 having a different dimension than the dimension of a second portion 342. For instance, the second portion 342 may have a larger diameter than the first portion 340. Additionally, the first bore 336 and second bore 338 may be adapted to receive the varying diameters of the pin 316. For example, the second bore 338 may have a larger diameter than a diameter of the first bore 336. It should be appreciated that the varying diameters of the pin and the varying diameter of the bores may strengthen the coupling between the first hinge member 312 and second hinge member 314, which may be prone to breaking due to impact force experienced when the frame is dropped or due to the movement of the hinge 110 when the head-mounted display system 100 is donned and doffed by a user. Further, the variation in diameters may help a user or factory worker identify how the pin 316 is inserted into the hinge 110.

As illustrated in FIG. 3B, the first hinge member 312 includes a first passage 344 extending therethrough. The first passage 344 is formed by interior walls 346 of the first hinge member 312. The first passage 344 allows wires to pass through the first hinge member 312. Additionally, the first passage 344 may circumvent the first pin housing 321 (which is better illustrated in FIG. 4D). For instance, the interior walls 346 may be positioned such that the first passage 344 is offset from the first pin housing 321. As such, any wiring that extends through the first hinge member 312 may circumvent the first pin housing 321.

Referring to FIG. 3C, the second hinge member 314 includes a second passage 348 extending therethrough. The second passage 348 is formed by interior walls 350 of the second hinge member 314. The second passage 348 may allow wires to pass through the second hinge member 314. In some aspects, the second passage 348 may circumvent the second pin housing 322 (which is better illustrated in FIG. 4D). For instance, the interior walls 350 may be positioned such that the second passage 348 are offset from the second pin housing 322. As such, any wiring that extends through the second hinge member 314 may circumvent the second pin housing 322.

Continuing, when the first hinge member 312 is mated with the second hinge member 314, the first passage 344 and the second passage 348 is offset from the first and second pin housing 321, 322. As such, any wiring extending through the hinge may circumvent the first and second pin housing 321, 322. It should be appreciated that the first passage 344 and the second passage 348 may be maintained despite the first hinge member 312 moving with respect to the second hinge member 314.

Figure 4A:
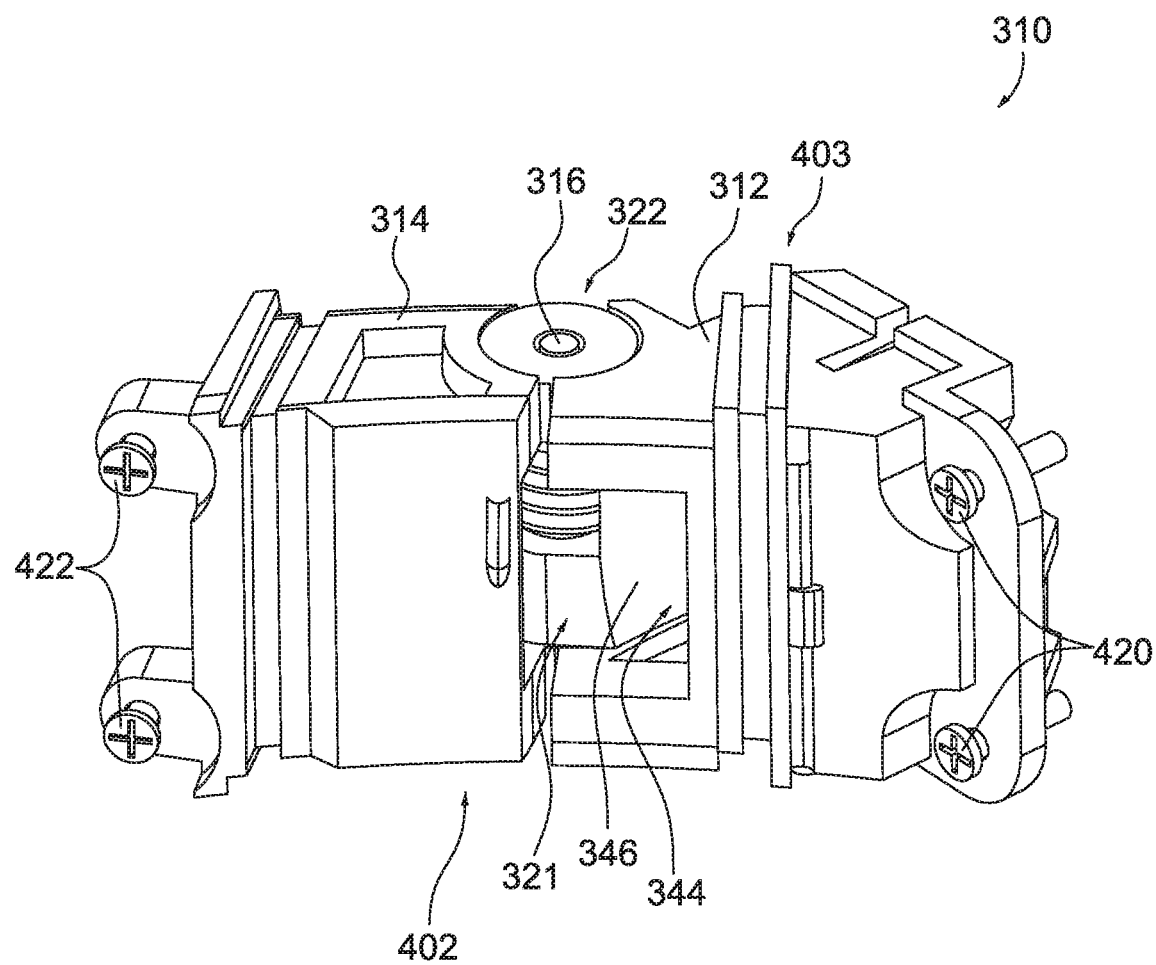
FIG. 4A is an assembled view of an interior face of the hinge system of FIG. 3A, in accordance with embodiments of the present technology.

FIG. 4A is an assembled view of the hinge system 310 of FIG. 3A from a first perspective of an inner-facing side 402, in accordance with embodiments of the present technology. In particular, FIG. 4A is taken from the perspective that illustrates the inner-facing side 402, which may correspond to a portion of the frame that faces a wearer's head. Similar to FIG. 3A, the hinge system 310 comprises the first hinge member 312 that mates with the second hinge member 314. The first pin housing 321 may mate with the second pin housing 322 such that the pin 316 is received by both the first pin housing 321 and the second pin housing 322. The first hinge member 312 may thus be pivotally coupled to the second hinge member 314. For the sake of clarity, FIG. 4A does not include a hinge cover, such as hinge cover 102.

As described above with respect to FIG. 1A, the first arm member 114 and the base member 112 may be coupled together via the hinge 110. In some aspects, the hinge system 310 couples the first arm member 114 to the base member 112. For example, the first hinge member 312 may be coupled to the base member 112 via an attachment mechanism 420 (e.g., screw, pin, adhesive, clip, or button). Similarly, the second hinge member 314 may be coupled to the first arm member 114 via an attachment mechanism 422 (e.g., screw, pin, adhesive, clip, or button). The attachment mechanisms 420, 422 may reversibly couple the arm members 115 to the base member 112. As such, the hinge system 310 may be a modular component that is distinct from the first arm member 114 and the base member 112. For example, the hinge system 310 may be formed separately from the first arm member 114 and the base member 112. Because the hinge system 310 may break when the head-mounted display system 100 experiences a large impact force, the modularity of the hinge system 310 allows it to be replaced without replacing the first arm member 114 or the base member 112.

Figure 4B:
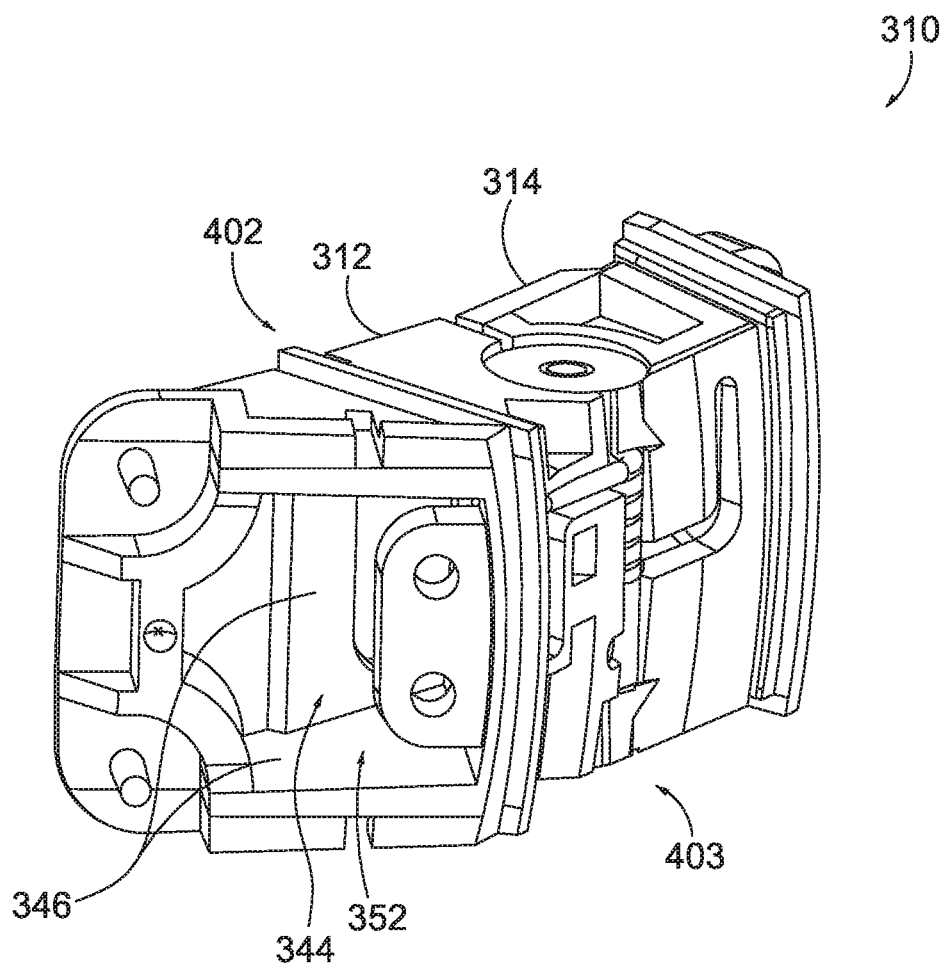
FIG. 4B is an assembled view of an exterior face of the hinge system of FIG. 3A, in accordance with embodiments of the present technology.

FIG. 4B is an alternative assembled view of the hinge system 310 of FIG. 3A, taken from a second perspective of an outer-facing side 403, in accordance with embodiments of the present technology. In particular, FIG. 4B is taken from the perspective that illustrates an exterior face, which may correspond to a portion of the frame that faces away from a wearer's head. Similar to FIG. 3A, the hinge system 310 comprises the first hinge member 312 that mates with the second hinge member 314. The first hinge member 312 includes the interior walls 346 that form the first passage 344. The interior walls 346 may form a first opening 352 (such as the first opening 206 of FIGS. 2A-B) that opens to a chamber associated with the base member 112 (such as the one or more base chambers 212 of FIGS. 2A-B). For the sake of clarity, FIG. 4B does not include a hinge cover, such as hinge cover 102.

Figure 4C:
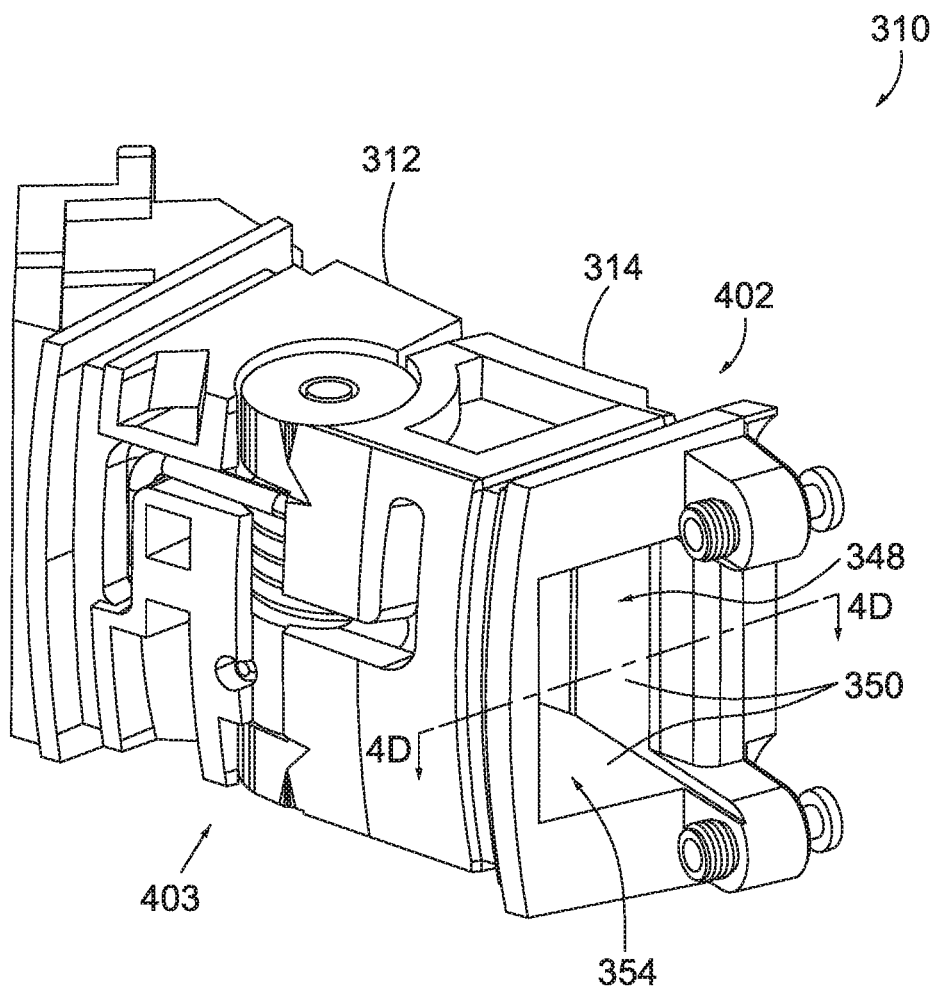
FIG. 4C is an assembled view of the exterior face of the hinge system of FIG. 3A, in accordance with embodiments of the present technology.

FIG. 4C is an assembled view of the exterior face 204 of the hinge system 310 of FIG. 3A taken from a third perspective of the outer-facing side 403, in accordance with embodiments of the present technology. Similar to FIG. 3A, the hinge system 310 comprises the first hinge member 312 that mates with the second hinge member 314. The second hinge member 314 may include the interior walls 350 that form the second passage 348. The interior walls 350 may form a second opening 354 (such as the second opening 208 of 2A-B) that opens to a chamber associated with an arm member (such as the arm chamber 216 of FIGS. 2A-B). For the sake of clarity, FIG. 4C does not include the hinge cover, such as hinge cover 102.

Figure 4D:
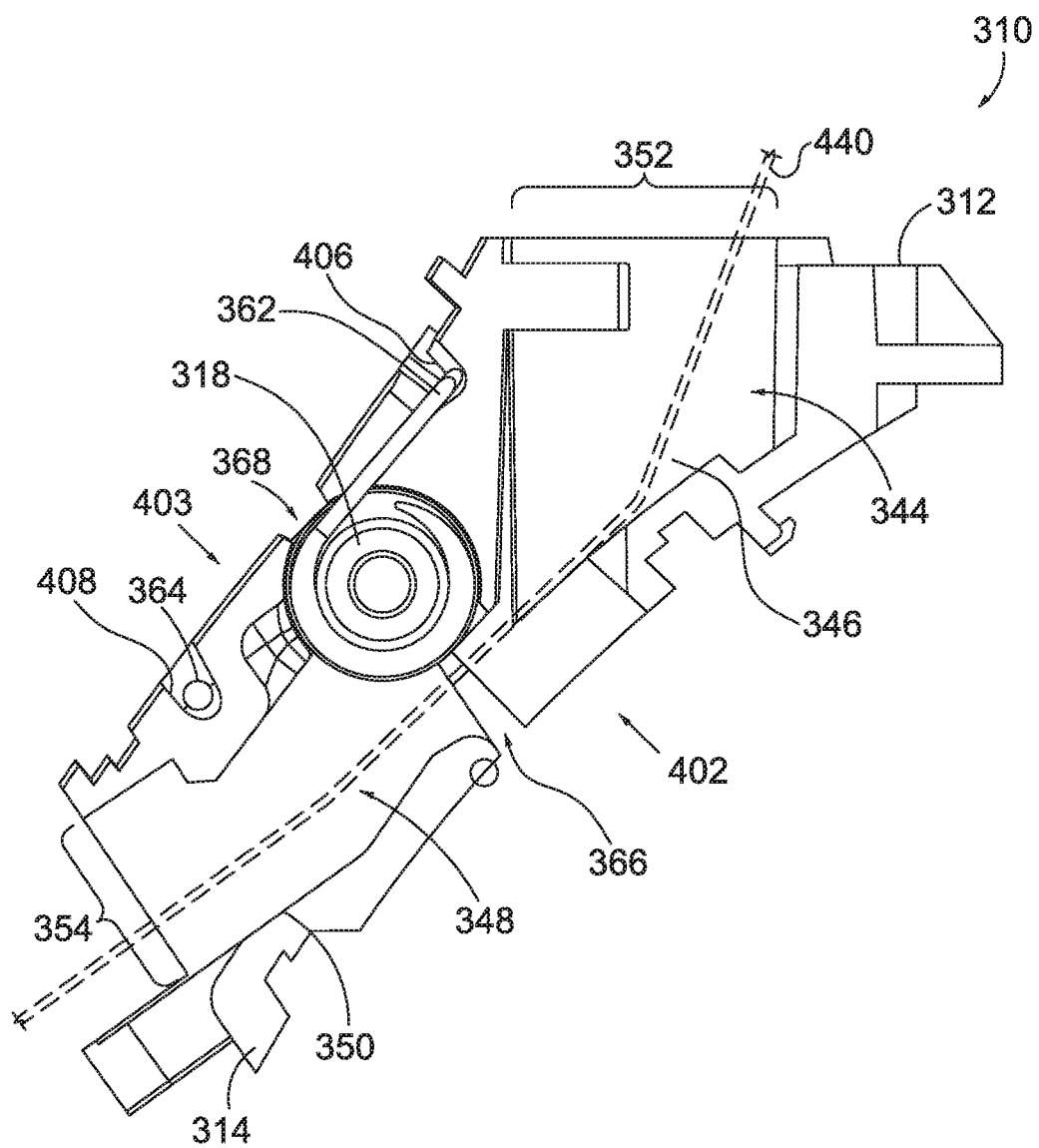
FIG. 4D is a top, cross-sectional, assembled view of the hinge system of FIG. 3A taken along cut line 4D-4D of FIG. 4C, in accordance with embodiments of the present technology.

FIG. 4D is a top, cross-sectional, assembled view of the hinge system 310 of FIG. 3A taken along line 4D-4D of FIG. 4C, in accordance with embodiments of the present technology. Similar to FIG. 3A, the hinge system 310 comprises the first hinge member 312 that mates with the second hinge member 314. As described, the first hinge member 312 couples to base member 112 while the second hinge member 314 couples to arm member 114.

As described above, the first hinge member 312 has interior walls 346 that form the first passage 344. The interior walls 346 may further form the first opening 352 that opens to a chamber associated with base member 112. Similarly, the second hinge member 314 has interior walls 350 that form the second passage 348. The interior walls 350 may further form the second opening 354 that opens to a chamber associated with arm member 114. Element 440 illustratively depicts wiring extending through the first passage 344 and second passage 348.

In some aspects, the biasing member 318 is a tensioning element. The tensioning element may be any element that biases the first hinge member 312 and the second hinge member 314 to a particular position. As shown in FIG. 4D, the biasing member 318 is a torsional spring having a first end 362 and a second end 364. In some aspects, the first end 362 may be configured to engage the first hinge member 312. For instance, the first end 362 may fit into a slot 406 on the first hinge member 312. The second end 364 may engage the second hinge member 314. For instance, the second end 364 may fit into a slot 408 on the second hinge member 314. As the hinge system moves away from a resting position, the biasing member 318 may bias the first hinge member 312 and second hinge member 314 back toward the resting position.

To allow the first hinge member 312 to move with respect to the second hinge member 314, the walls of the first hinge member 312 and second hinge member 314 may provide a first gap 366 between the first hinge member 312 and the second hinge member 314. For example, the interior gap 366 may be formed between the walls of the first hinge member 312 and the walls of second hinge member 314 on the inner-facing side 402. Referring to FIG. 2A, the first gap 366 may allow the head-mounted display system 100 to move from the first position 120 to the second position 122.

Continuing, the walls of the first hinge member 312 and second hinge member 314 may provide a second gap 368 between the first hinge member 312 and the second hinge member 314. For example, the second gap 368 may be formed between the walls of the first hinge member 312 and the walls of second hinge member 314 along the outer-facing side 403. Referring to FIG. 2A, the second gap 368 may allow the head-mounted display system 100 to move from the first position 120 to the third position 124. In some aspects, the first gap 366 is spaced apart from the second gap 368 by the biasing member 318 and/or the first and second pin housing 321, 322.

Figure 5A:
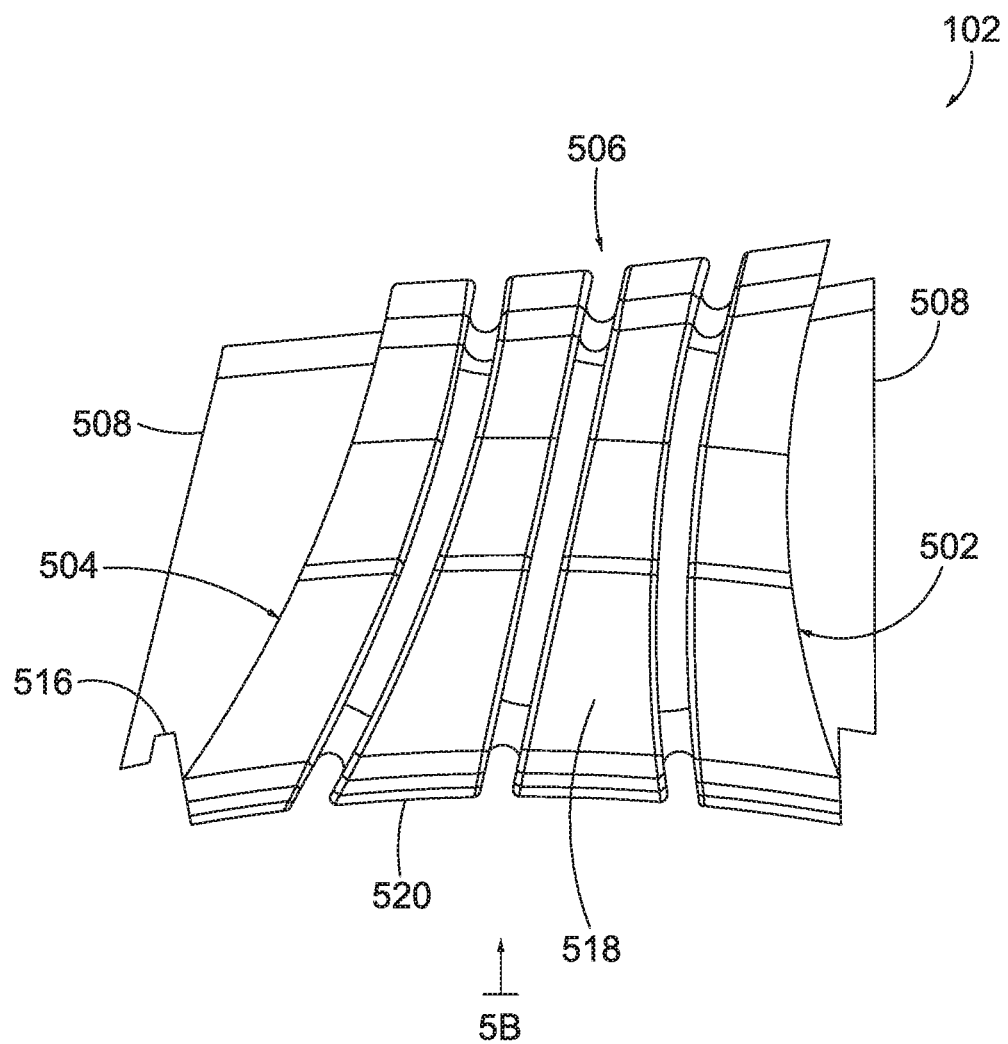
FIG. 5A is a top view of a hinge cover for a hinge system, in accordance with embodiments of the present technology.
Figure 5B:
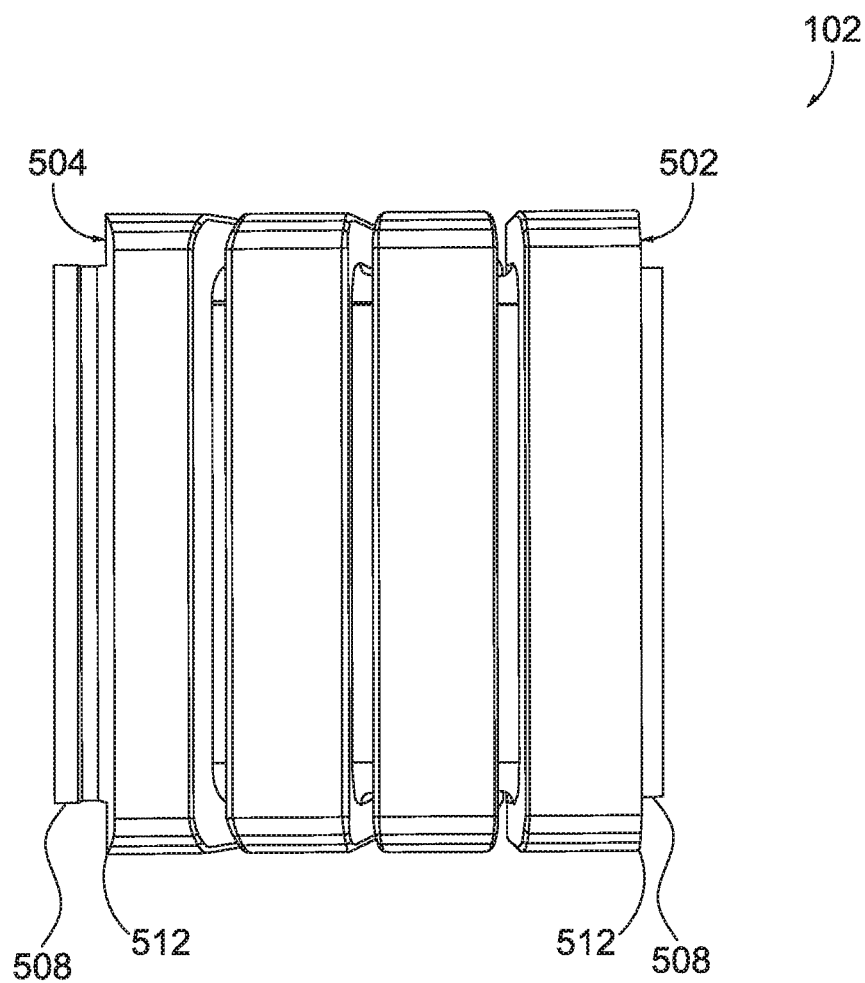
FIG. 5B is a side view of the hinge cover of FIG. 5A, in accordance with embodiments of the present technology.

FIGS. 5A-B are a top and side view of hinge cover 102 for a hinge system, in accordance with embodiments of the present technology. The hinge cover 102 may include a body 518 extending from a first face 502 to a second face 504. The body 518 may include one or more sides 506 that extend longitudinally from the first face 502 to the second face 504. The body 518 may have a polygonal, circular, rectangle, square, or elliptical cross-section. As shown in FIGS. 5A-B, in some aspects, the hinge cover 102 has a substantially rectangular cross-section.

The interior walls of the body 518 may form a hollow interior that receives a hinge system, such as the hinge system 310 of FIG. 3. For instance, the hinge cover 102 may have a hollow interior formed by interior walls of the body 518. The hollow interior of the body 518 may thus receive the hinge system while the hinge cover 102 is slid onto or over the hinge. When assembled, the hinge cover 102 may enclose at least a portion of the hinge system. By way of example, the one or more sides 506 may enclose a corresponding portion of the hinge system when the hinge cover 102 is slid into position. As can be seen in FIG. 1A, the head-mounted display system 100 includes a hinge cover 102 that encloses the hinge 110. It is contemplated that the body 518 may comprise one or more ribbed portions 520. In some aspects, the one or more ribbed portions 520 include alternating channels and ridges on at least one of the outer or inner surfaces of the body 518, or both.

In some aspects, the hinge cover 102 may include a lip 508 extending from a first face 502 and/or a second face 504. The lip 508 may be any type of protrusion that extends away from the first face 502 and/or second face 504. For example, the lip 508 may be a straight, angled, or curved protrusion. In some aspects, the lip 508 is located along substantially all of a perimeter or circumference of the first face 502 and/or the second face 504.

Figure 6:
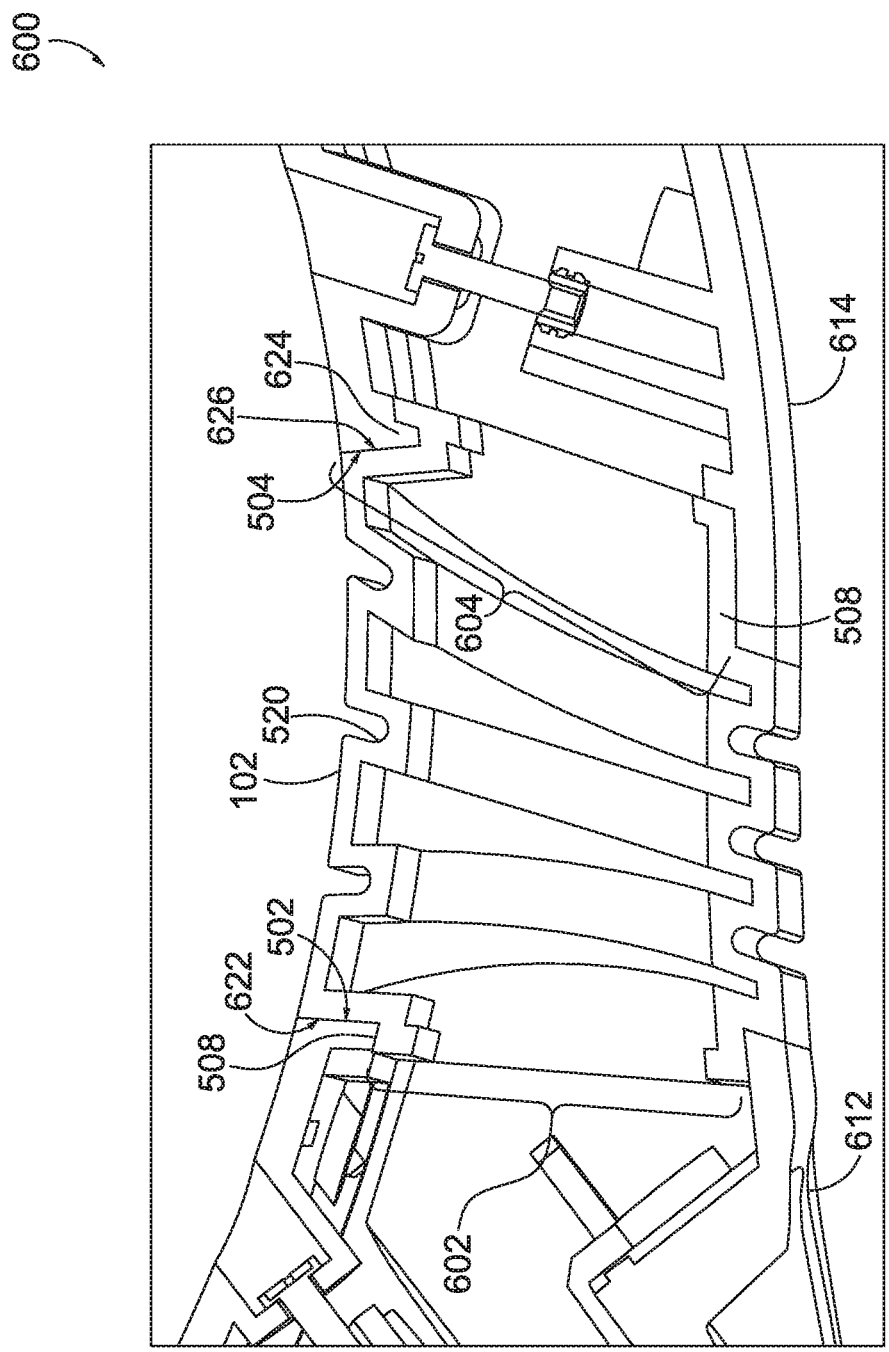
FIG. 6 is a top, cross-sectional view of the hinge cover of FIG. 5A when the hinge cover is positioned in an as-used configuration with a head-mounted display system, in accordance with embodiments of the present technology.

The lip 508 overlaps with a portion of an arm member or base member, such as the first arm member 114 or base member 112 of FIG. 1A. The lip 508 may overlap along an interior or exterior portion of the arm or base member. As shown in FIG. 6, the lip 508 overlaps along an interior portion of the arm and base member. In some aspects, the lip 508 may be positioned between the hinge member 110 and the arm member 614 or base member 612. This allows the hinge cover 102 to be held in place. Alternatively, it is contemplated that the lip 508 may overlap an exterior portion of an arm member or a base member.

Referring to FIG. 5B, the lip 508 may be located anywhere along the first face 502 and/or the second face 504. In some aspects, the lip 508 may be offset from an outer edge 512 of the hinge cover 102. By offsetting the lip 508, the lip 508 may be received into an opening by an arm member or base member, such as the first arm member 114 or base member 112 of FIG. 1. As shown in FIG. 6, one or more portions of the lip 508 may be received into an opening 602 of a base member 612. One or more portions of the lip 508 may be also be received into an opening 604 of an arm member 614. It should be appreciated that the lip 508 may assist in protecting the internal components (e.g., circuitry, computer processor) of a modular head-mounted display system from external elements (e.g., dust or moisture).

In some aspects, the lip 508 and a modular component (e.g., the arm or base member) may include corresponding grooves to secure the hinge cover 102 to the modular component. The corresponding grooves may include an indentation and/or a protrusion. Referring to FIG. 5A, the hinge cover 102 comprises an indentation 516 on a surface of the lip 508 that mates with a protrusion of a modular component. For instance, as shown in FIG. 6, the arm member 614 includes a protrusion 624 extending inward from an interior wall of the arm member 614. When assembled, the corresponding grooves (e.g., indentation and protrusion) assist in securing the body 518 of the hinge cover 102 to the modular head-mounted display system. These corresponding grooves also provide an additional barrier that prevents dust and moisture from entering into the internal chambers of a modular head-display system.

In some aspects, the hinge cover 102 may be made of a flexible material. For instance, the hinge cover 102 may be made of rubber, silicone, or any other similar material. The flexible material aids in allowing the hinge cover 102 to adjust to the different positions as one or more arm members move with respect to a base member. In some aspects, the hinge cover 102 may be formed to be a single component. For example, the hinge cover 102 may be formed through a molding process. Alternatively, the hinge cover 102 may comprise multiple components that are coupled or attached to one another.

FIG. 6 illustrates a top, cross-sectional view of the hinge cover 102 of FIG. 5 when the hinge cover 102 is positioned in an as-used configuration 600 with a head-mounted display system in accordance with embodiments of the present technology. For the sake of clarity, the hinge is not depicted. As mentioned, the hinge cover 102 may include alternating channels and ridges on both the outer or inner surfaces of the body 518. As illustrated, the hinge cover 102 has a cross-sectional area that varies along the longitudinal axis. The one or more ribbed portions 520 may aid in the allowing the hinge cover 102 to flex as the hinge moves, such as when the arm member 114 moves with respect to the base member 112.

In the as-used configuration 600 (e.g., when the hinge cover 102 is slid into position over the hinge), the first face 502 may be positioned adjacent to a face 622 of a base member 612, such as base member 112 of FIG. 1A. In some aspects, the first face 502 abuts the face 622 of the base member 612 to prevent external elements (e.g., dust or moisture) from entering the interior chambers of the head-mounted display system. It is contemplated that, in some aspects, the first face 502 may be prevented from touching the face 622 of the base member 612 based on an intermediate sealing component.

Continuing, the second face 504 may be positioned adjacent to a face 626 of an arm member 614, such as first arm member 114 of FIG. 1A. In some aspects, the second face 504 abuts the face 626 of the arm member 614 to prevent external elements (e.g., dust or moisture) from entering the interior chambers of the head-mounted display system. It is contemplated that, in some aspects, the second face 504 may be prevented from touching the face 626 of the arm member 614 based on an intermediate sealing component.

Figure 7:
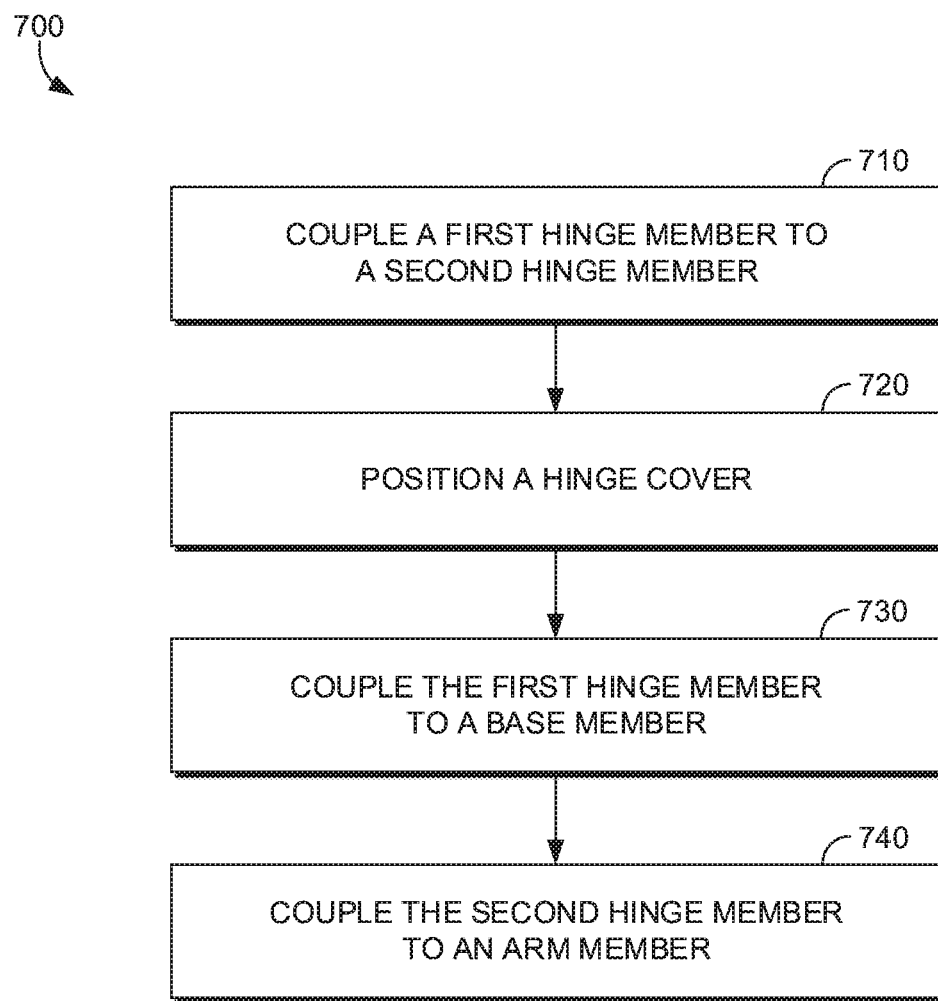
FIG. 7 is a flow diagram of an exemplary method of assembling a head-mounted display system, in accordance with embodiments of the present technology.

FIG. 7 is a flow diagram 700 of an exemplary method of assembling a head-mounted display system, in accordance with embodiments of the present technology. At block 710, a first hinge member, such as the first hinge member 312 of FIGS. 3A-4D, is coupled to a second hinge member, such as the second hinge member 314 of FIGS. 3A-4D. For instance, a first pin housing may be aligned with a second pin housing and a pin may be inserted into one or more bores, as described with respect to FIGS. 3A-4D. At block 720, a hinge cover, such as the hinge cover 102 of FIGS. 5-6, may be positioned over the first and second hinge member. At block 730, the first hinge member may be coupled to a base member, such as the base member 112 of FIG. 1. At block 740, the second hinge member may be coupled to an arm member, such as the first arm member 114 of FIGS. 1-2B. While not shown, flow diagram 700 may further include positioning a hinge cover so that it overlaps with the arm member or the base member, or a combination thereof.

Electrical Components

Figure 8:
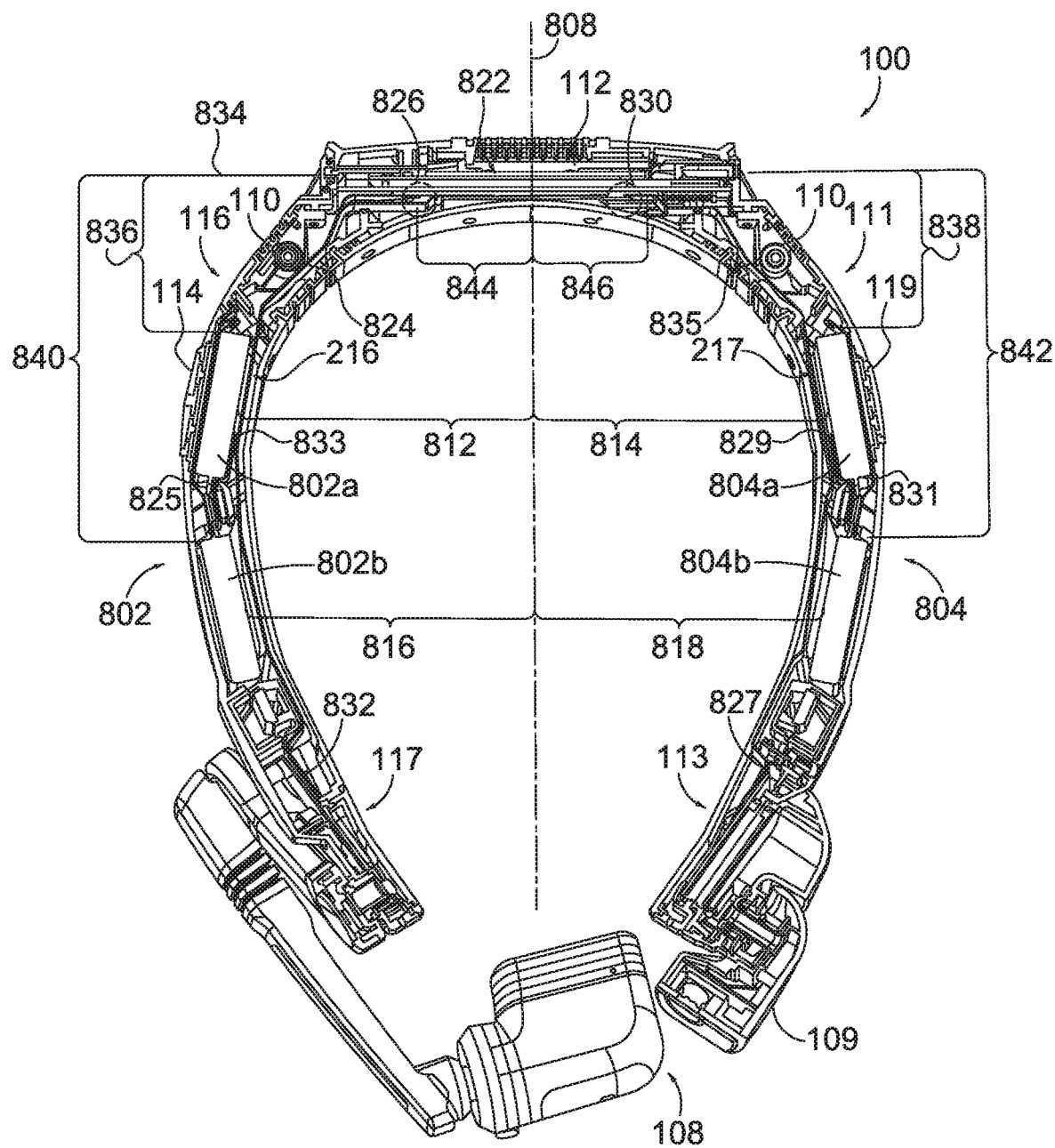
FIG. 8 illustrates a top, cross-sectional view with portions removed to show electrical components of the head-mounted display system of FIGS. 1A-B, in accordance with embodiments of the present technology.

FIG. 8 illustrates a top, cross-sectional view of the head-mounted display system 100 of FIG. 1A. The head-mounted display system 100 includes one or more batteries 802, 804 positioned within the first and second arm members 114, 119. As described in reference to FIGS. 2A-B, the first and second arm members 114, 119 have arm chambers 216, 217. Arm chambers 216, 217 may extend throughout the first and second arm members 114, 119. For instance, the first and second arm chamber 216, 217 may extend from the distal ends 117, 113 to the proximal ends 116, 111 of the first and second arm members 114, 119. One or more first arm batteries 802 may be positioned within the first arm chamber 216. Similarly, one or more second arm batteries 804 may be positioned within the second arm chamber 217.

The head-mounted display system 100 may also include one or more third batteries 820. The one or more third batteries 820 may be positioned between the one or more first arm batteries 802 and the one or more second arm batteries 804. For example, the one or more third batteries 820 may be positioned at an intermediate member between the first arm member 114 and the second arm member 119. As illustrated in FIG. 8, the one or more third batteries 820 may be positioned at the base member 112. The one or more third batteries 820 may be positioned at any location along the base member 112, such as within one or more base chambers 212 or along an exterior of the base member 112, as described in greater detail with respect to FIGS. 12-17. The one or more third batteries 820 may provide additional power to satisfy an electrical load while distributing the weight of the additional batteries throughout the frame to improve the comfort of wearing the head-mounted display system 100.

To improve the capacity of power available to the head-mounted display system 100 and to reduce the profile of the frame (e.g., width and/or height), the first and/or the second arm batteries 802, 804 may include at least two batteries. For instance, as illustrated, the first arm member 114 includes at least two first arm batteries 802a, 802b that are positioned longitudinally along the first arm member 114. The second arm member 119 includes at least two batteries 804a, 804b that are positioned longitudinally along the second arm member 119. Utilizing a plurality of batteries within each arm member gives the head-mounted display system 100 a slimmer profile, making it less cumbersome than traditional head-mounted display systems and therefore less likely to fall off a user's head.

As illustrated, the batteries 802, 804 may be positioned between the proximal end 116, 111 (also referred to as a first and second end 116, 111) and the distal end 117, 113 of the first and/or second arm member 114, 119. In some aspects, the batteries 802, 804 may be positioned between the hinge 110 and the distal end 117, 113 of the first and/or second arm member 114, 119. For example, the one or more first arm batteries 802 may be positioned between hinge 110 and distal end 117 of the first arm member 114. The one or more second arm batteries 804 may be positioned between hinge 110 and distal end 113 of the second arm member 119. In example aspects, the one or more first arm batteries 802 and the one or more second arm batteries 804 may be positioned proximate a wearer's ears.

The first and second arm batteries 802, 804 may be positioned to evenly distribute the weight of the batteries throughout the head-mounted display system 100. As explained in greater detail below, the position of the first and second arm batteries 802, 804 may be symmetrical about a longitudinal axis 808 to help with distributing the weight of the batteries from a side-to-side (or horizontal) perspective. Additionally or alternatively, the position of the first and second arm batteries 802, 804 may be positioned to evenly distribute the weight of the batteries from a front-to-rear (or lengthwise) perspective.

To facilitate the side-to-side weight distribution of the batteries, the first and second arm batteries 802, 804 may be positioned symmetrically about the longitudinal axis 808. The longitudinal axis 808 generally extends lengthwise through a center of the head-mounted display system 100. The longitudinal axis 808 may extend substantially perpendicular to the base member 112. The longitudinal axis 808 may extend in a lengthwise direction, from the proximal ends 116, 111 toward the distal ends 117, 113 of arm member 114, 119. When in an as-worn configuration, the longitudinal axis 808 may extend from the back of a person's head and toward the front of the person's head. The longitudinal axis 808 may divide the head-mounted display system 100 to a left and right side, which, when in an as-worn configuration, may correspond to the sides of the wearer's head.

In some aspects, the longitudinal axis 808 can be drawn through one or more points that are substantially equidistant between a first and second end of the base member 112. Additionally or alternatively, the longitudinal axis 808 can be drawn through one or more points that are about equidistant between the first ends (e.g., 116, 111) of the first and second arm members 114, 119 and one or more points that are about equidistant between the second ends (e.g., 117, 113) of the first and second arm members 114, 119. In some aspects, the longitudinal axis 808 can be drawn through one or more points that are about equidistant from one or more interior surfaces of the first and second arm members 114, 119.

As illustrated, the positions of the first arm batteries 802 and second arm batteries 804 may have similar dimensions when measured with respect to the longitudinal axis 808. Specifically, a first arm battery 802a may be positioned at a first distance 812 from the longitudinal axis 808. The second arm battery 804a may be positioned at a second distance 814 from the longitudinal axis 808. In some aspects, the dimension of the first distance 812 is within about 20% of the dimension of the second distance 814. In further aspects, the dimension of the first distance 812 is within about 10% of the dimension of the second distance 814. In other aspects, the dimension of the first distance 812 is within about 5% of the dimension of the second distance 814. In even further aspects, the dimension of the first distance 812 is within about 1% of the dimension of the second distance 814. In some aspects, the dimension of the first distance 812 corresponds to the dimension of the second distance 814.

Continuing, a first arm battery 802b may be positioned at a third distance 816 from the longitudinal axis 808. The second arm battery 804b may be positioned at a fourth distance 818 from the longitudinal axis 808. In some aspects, the dimension of the third distance 816 is within about 20% of the dimension of the fourth distance 818. In further aspects, the dimension of the third distance 816 is within about 10% of the dimension of the fourth distance 818. In other aspects, the dimension of the third distance 816 is within about 5% of the dimension of the fourth distance 818. In even further aspects, the dimension of the third distance 816 is within about 1% of the dimension of the fourth distance 818. In some aspects, the dimension of the third distance 816 corresponds to the dimension of the fourth distance 818. The term "about" when used herein with reference to numbers or numerical ranges means within ±10% of a designated value unless indicated otherwise.

In some aspects, the position of the first arm batteries 802 and the second arm batteries 804 may be measured with respect to a center of gravity. For example, the position of the first arm batteries 802 and the second arm batteries 804 establish a center of gravity that is proximate a center point of the head-mounted display system 100. In some aspects, the position of the first arm batteries 802 and the second arm batteries 804 establish a center of gravity that is within two inches of the longitudinal axis 808. In additional aspects, the position of the first arm batteries 802 and the second arm batteries 804 establish a center of gravity that is within one inch of the longitudinal axis 808. In further aspects, the position of the first arm batteries 802 and the second arm batteries 804 establish a center of gravity that is within 0.5 inches of the longitudinal axis 808. In another aspect, the position of the first arm batteries 802 and the second arm batteries 804 establish a center of gravity that falls along the longitudinal axis 808. As such, a weight of the first arm batteries 802 may be counter balanced by a weight of the second arm batteries 804 such that the wearer does not experience a significant side-to-side weight differential. It should be appreciated that this reduces the likelihood of the head-mounted display system 100 from falling of the wearer's head. Additionally, it improves the overall comfort of the head-mounted display system 100, especially if worn for extended periods of time.

To facilitate the front-to-back weight distribution of the batteries, the first and second arm batteries 802, 804 may be positioned such that the batteries have similar lengthwise positions as measured with respect to a widthwise axis 834. As illustrated, the widthwise axis 834 extends through the base member 112. However, the widthwise axis 834 may extend through any portion of the head-mounted display system 100.

The position of the first and second arm batteries 802, 804 may have similar dimensions when measured with respect to the widthwise axis 834. As illustrated, first arm battery 802a may be positioned at a first distance 836 from the widthwise axis 834. The second arm battery 804a may be positioned at a second distance 838 from the widthwise axis 834. In some aspects, the dimension of the first distance 836 is within about 20% of the dimension of the second distance 838. In further aspects, the dimension of the first distance 836 is within about 10% of the dimension of the second distance 838. In other aspects, the dimension of the first distance 836 is within about 5% of the dimension of the second distance 838. In even further aspects, the dimension of the first distance 836 is within about 1% of the dimension of the second distance 838. In some aspects, the dimension of the first distance 836 is substantially equal to the dimension of the second distance 838.

Continuing, the first arm battery 802b may be positioned at a third distance 840 from the widthwise axis 834. The second arm battery 804b may be positioned at a fourth distance 842 from the widthwise axis 834. In some aspects, the dimension of the third distance 840 is within about 20% of the dimension of the fourth distance 842. In further aspects, the dimension of the third distance 840 is within about 10% of the dimension of the fourth distance 842. In other aspects, the dimension of the third distance 840 is within about 5% of the dimension of the fourth distance 842. In even further aspects, the dimension of the third distance 840 is within about 1% of the dimension of the fourth distance 842. In some aspects, the dimension of the third distance 840 is substantially equal to the dimension of the fourth distance 842.

It should be appreciated that the distances for the first arm batteries 802 and the second arm batteries 804 (such as distances 812, 814, 816, 818, 836, 838, 840, or 842) may be measured with respect to any point or surface of the battery. For instance, distances 836, 838, 840, and 842 may be taken at a point on the first batteries 802 and the second arm batteries that is closest to the widthwise axis 834. Additionally or alternatively, distances 812, 814, 816, and 818 may be measured with respect to a point on an inner-facing surface of the battery. In some aspects, the distances 812, 814, 816, or 818 are measured from a point on the inner-facing surface that is halfway between the ends of the battery being measured.

As mentioned, the first and second arm batteries 802, 804 may be positioned within the first arm 114 and second arm 119, respectively. The positions of the first and second arm batteries 802, 804 allow for wiring to be positioned adjacent to the batteries and within the arm chambers 216, 217. As described in greater detail below, wiring from I/O devices may extend from distal ends 117, 113 of the arm members 114, 119, through the arm chambers 217, 216, and into the base member 112. For instance, the first arm batteries 802 or second batteries 804 may be positioned within the first or second arm chambers 216, 217 so as to allow one or more camera wiring connections 827 and/or one or more display wiring connections 832 to extend through the arm members 114, 119. Specifically, the first arm batteries 802 may be positioned so as to allow wiring to extend between a surface of the first arm batteries 802 and an interior wall of the first arm 114. Similarly, the second arm batteries 802 may be positioned so as to allow wiring to extend between a surface of the second arm batteries 802 and an interior wall of the second arm 119. By positioning both the wiring and batteries within the arm members, the internal electrical components may be protected from external elements (e.g., dust or water). Additionally, the wiring and the batteries are protected from being snagged or falling out of position.

Referring still to FIG. 8, the head-mounted display system 100 includes a battery monitor 822. The battery monitor 822 generally manages the battery power. For instance, the battery monitor 822 may regulate voltage, may regulate charging functions, and/or a load drawn from the batteries of the head-mounted display system 100. The battery monitor 822 may be any power management device and/or chip, such as a power management integrated circuit and/or computing device. The battery monitor 822 is electrically coupled to the first arm batteries 802 and second arm batteries 804 via the first wires 824 and the second wires 835, respectively.

Figure 10:
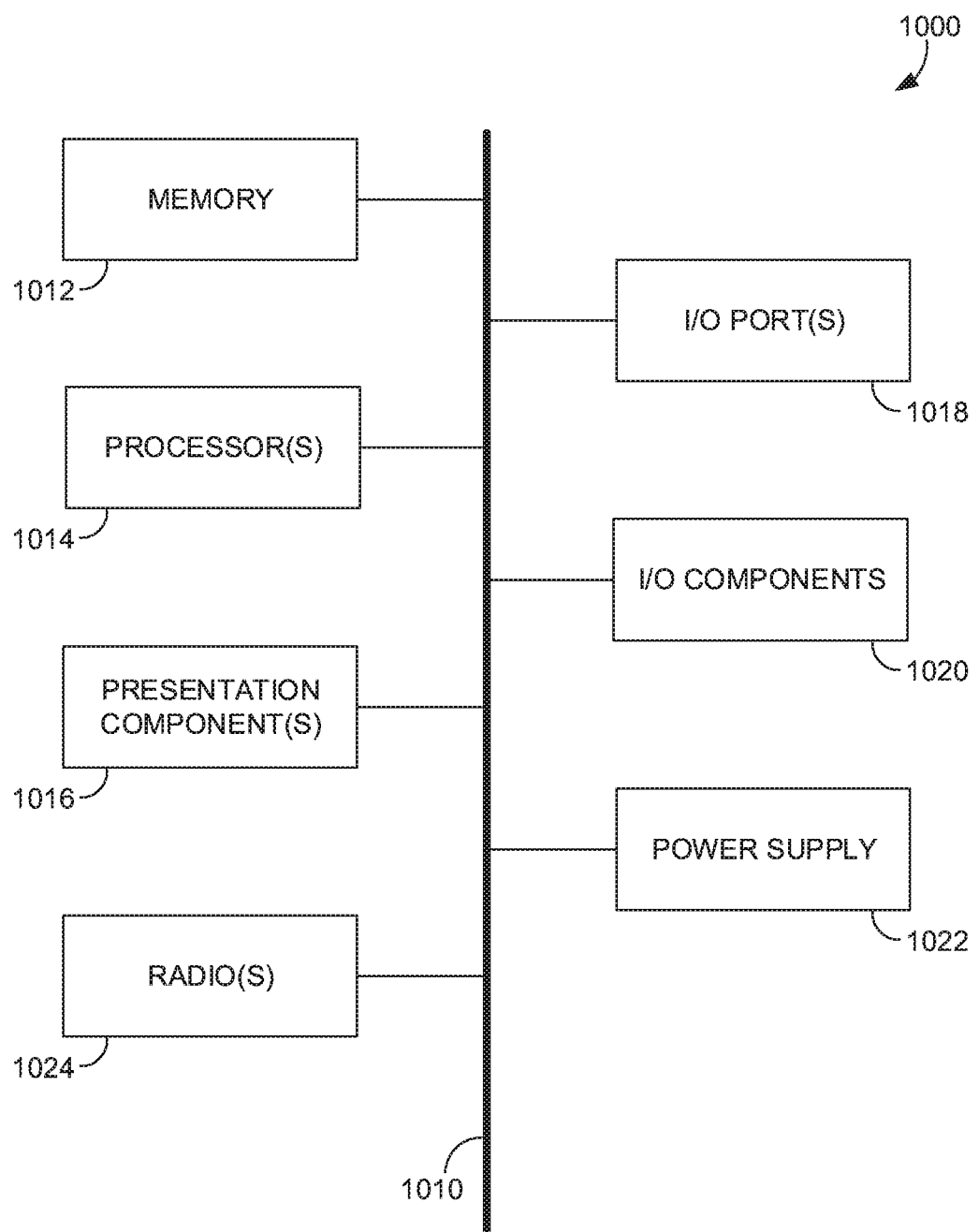
FIG. 10 is an exemplary computing environment for use with a head-mounted display, in accordance with an embodiment of the present technology.

The battery monitor 822 may facilitate drawing power from the first and second arm batteries 802, 804 to satisfy an electrical load of the head-mounted display system 100, such as the load created by the one or more display modules 108, one or more cameras 109, and a computing device (e.g., computing device 1000 of FIG. 10). To satisfy the load, the battery monitor 822 may balance the load between the first arm batteries 802 and the second arm batteries 804. The battery monitor 822 may balance the charge of the first arm batteries 802 and the second arm batteries 804.

As illustrated, the battery monitor 822 may be positioned between the one or more first arm batteries 802 and the one or more second arm batteries 804. For example, the battery monitor 822 is positioned within a base chamber (e.g., the one or more base chambers 212 of FIG. 2A) of the base member 112. The battery monitor 822 is in communication with and/or coupled to the first arm batteries 802 and the second arm batteries 804 via one or more first wires 824 and one or more second wires 835, respectively. For instance, the first wires 824 are coupled to a first battery monitor terminal 826 at a first end and coupled to a first battery terminal 825 at a second end. Similarly, the second wires 835 are coupled to a second battery monitor terminal 830 at a first end and coupled to a second battery terminal 831 at a second end. The terminal (e.g., first battery monitor terminal 826, first battery terminal 825, second battery monitor terminal 830, and/or the second battery terminal 831) may include any coupling point, such as a pin connector, set screw, fork or ring terminal, soldering, or the like.

Distributing a plurality of batteries throughout the frame introduces several technical challenges, such as maintaining a balanced load or charge between the first arm batteries 802 and the second arm batteries 804. Errors in balancing the load or charge of the batteries may cause the head-mounted display system 100 and/or the batteries to malfunction. As described in greater detail herein, the battery monitor 822 may be positioned such that a length of a wire between the battery monitor 822 and the first arm batteries 802 is a similar length as the length of a wire between the battery monitor 822 and the second arm batteries 804.

By way of example, the battery monitor 822 may be positioned such that the first wires 824 are about the same length as the second wires 835. Maintaining a similar length in wiring improves the capabilities of the battery monitor 822 to maintain a charge in both the first and second arm batteries 802, 804. Additionally or alternatively, similar lengths in wiring reduces any further steps to account for the difference in lengths of wiring, such as altering the gauge of either the first wires 824 or the second wires 835 to account for differences in their lengths.

The difference in the lengths of the first and second wires 824, 835 can be determined based on a ratio of their length. For instance, the length of the one or more first wires 824 may within about 20% of the length of the one or more second wires 835. As a further example, the length of the one or more first wires 824 may within about 10% of the length of the one or more second wires 835. As an additional example, the length of the one or more first wires 824 may be within about 5% of the length of the one or more second wires 835. As another example, the length of the one or more first wires 824 may be within about 1% of the length of the one or more second wires 835. In some aspects, the length of the one or more first wires 824 may be substantially equal to the length of the one or more second wires 835.

In some aspects, the length of the first and/or second wires 824, 835 may be defined as the length of wiring between the first and/or second battery monitor terminal 826, 830 and the first and/or second battery terminal 825, 831. It is contemplated that the length of the first wires 824 and/or the second wires 835 may be defined as the length of the wire between the monitor terminal (e.g., 826 and or 830) and a juncture associated with the batteries of each arm, such as junctures 833, 829 respectively. Junctures 833, 829 may be a terminal of protection circuit board (PCB) positioned in each arm.

As illustrated, the first wires 824 may be a single section of wire that extends from the first battery terminal 825 (or juncture 833) to the first battery monitor terminal 826. The one or more first wires 824 may be removably coupled to the first battery terminal 825 (or juncture 833) and/or the first battery monitor terminal 826. Similarly, the second wires 835 may be a single section of wire that extends from a second battery terminal 831 (or juncture 829) to the second battery monitor terminal 826. The one or more second wires 835 may be removably coupled to the one or more second arm batteries 804 and/or the battery monitor 822. In some instances, utilizing a single section of wiring may facilitate easier assembly of the head-mounted display system 100 because it reduces the number of electrical connections to be made during assembly. However, it is contemplated that the one or more first wires 824 or the one or more second wires 835 may not be a single section of wire. For instance, the one or more first wires 824 and/or the one or more second wires 835 may include multiple sections of wire electrically coupled together.

As mentioned, the first wires 824 and the second wires 835 are positioned within the interior of the first or second arm members 114, 119. In some aspects, the first wires 824 and the second wires 835 are also positioned within the base member 112. For example, the first wires 824 and the second wires 835 may extend from the first or second arm members 114, 119, through the one or more hinges 110, and into the base member 112. The first wires 824 and/or the second wires 835 may extend through a passage of the hinge 110, such as a first passage 344 of FIG. 3B and a second passage 348 of FIG. 3C. It should be appreciated that because the first wires 824 and the second wires 835 extend throughout the interior of the head-mounted display system 100, the wiring is not at risk of catching or snagging, which could damage the wiring and/or disconnect it from the battery monitor 822.

As described in greater detail with respect to FIG. 2A, the first arm 114 and/or second arm 119 may move with respect to the base member 112 and/or each other. To accommodate the movement of the first arm 114 and the second arm 119, portions of the first wires 824 and/or second wires 835 extending through the hinges 110 may float. In some aspects, the entire portion of the first wires 824 and/or the second wires 835 extending through the hinges 110 may float. For instance, the portions of the one or more first wires 824 and/or the second wires 835 extending through the hinge 110 may remain free to move with respect to the interior walls of the hinge 110.

Additionally or alternatively, the first wires 824 and/or the second wires 835 may have a sufficient length to allow the first arm 114 and/or second arm 119 to move with respect to the base member 112 and/or each other. As described with respect to FIG. 2A, the first or second arm member 114, 119 may move from the first position to either the second position or the third position. As such, the first wires 824 and/or second wires 835 may have a length that accommodates the displacement of the first arm member 114 and/or the second arm member 119.

As mentioned, the battery monitor 822 may be positioned within the base member 112. In some aspects, the position of the battery monitor 822 within the base member 112 may cause the first and second monitor terminal 826, 830 to be offset from the longitudinal axis 808. For example, the first monitor terminal 826 and the second monitor terminal 830 may be spaced apart from the longitudinal axis 808 by a distance 844 and a distance 846, respectively.

The battery monitor 822 may be positioned such that the distance 844 is similar to the distance 846. The position of the first and second monitor terminals 826, 830 may facilitate similar lengths of the first wires 824 and the second wires 835. As mentioned, maintaining similar lengths of the first and second wires 824, 835 allows the battery monitor 822 to more accurately manage the batteries located in the arm members 114, 119.

The difference between the distance 844 and the distance 846 may be measured with respect a particular dimension (e.g., a width) of the longitudinal axis 808. For instance, distance 844 may be within about five inches of distance 846. In other aspects, distance 844 may be within about four inches of distance 846. In still further aspects, distance 844 may be within about three inches of distance 846. In other aspects, distance 844 may be within about one inch of distance 846. In some aspects, distance 844 may be about substantially equal to distance 846.

Additionally or alternatively, the difference in the dimensions of distance 844 and distance 846 may be measured with respect to a ratio between the two dimensions. For instance, the dimension (e.g., width) of distance 844 may be within 50% of the dimension (e.g., width) of distance 846. In other aspects, the dimension of distance 844 may be within 30% of the dimension of distance 846. In further aspects, the dimension of distance 844 may be within 15% of the dimension of distance 846. In still further aspects, the dimension of distance 844 may be within 5% of the dimension of distance 846. In some aspects, the dimension of distance 844 may be substantially equal to the dimension of distance 846. It is within the scope of this disclosure that the first terminal 826 and/or the second terminal 830 are not spaced apart from the longitudinal axis 808.

Referring still to FIG. 8, wiring for other electrical components of the head-mounted display system 100 (such as I/O components 1020 of FIG. 10) may extend throughout the interior of the first arm member 114, the second arm member 119, the base member 112, and/or the hinges 110. The wiring for the electrical components, such as the I/O components, may couple to a computing device (such as computing device 1000 of FIG. 10) that is positioned in the base member 112.

More specifically, the display module 108 may be mounted at the distal end 117 of the first arm member 114. One or more display wires 832 may couple the display module 108 to the computing device positioned in the base member 112. As such, the one or more display wires 832 may extend from the distal end 117 to the proximal end 116 through the arm chambers 216. The arm chambers 216 may extend throughout the interior of the arm member 114. The one or more display wires 832 may then extend through the hinge 110 and into one or more base chambers 212. By way of example, the one or more display wires 832 may include a display serial interface (DSI) cable.

Continuing, the one or more cameras 109 may be mounted at the distal end 113 of the second arm member 119. As such, one or more camera wires 827 may extend from the distal end 113 to the proximal end 111 of the second arm member 119 via the arm chambers 217. The one or more camera wiring connections 827 may also extend through the hinge 110 and into one or more base chambers 212. Accordingly, the passage through the one or more hinges 110 (e.g., first passage 344 and/or second passage 348) allows for multiple wiring connections to extend through the frame of the head-mounted display system 100.

It should be appreciated that positioning the computing device within the base member 112 maintains an even distribution of weight of the electrical components throughout the head-mounted display system 100. The position also allows the distal end 117 of the first arm member 114 and the distal end 113 of the second arm member 119 to remain unattached so as to move with respect to one another. This allows a wearer to quickly adjust the head-mounted display system 100 to fit his or her head. Additionally, as described herein, allowing the one or more arm members to move with respect to one another improves the impact resistance of the head-mounted display system 100.

Figure 9:
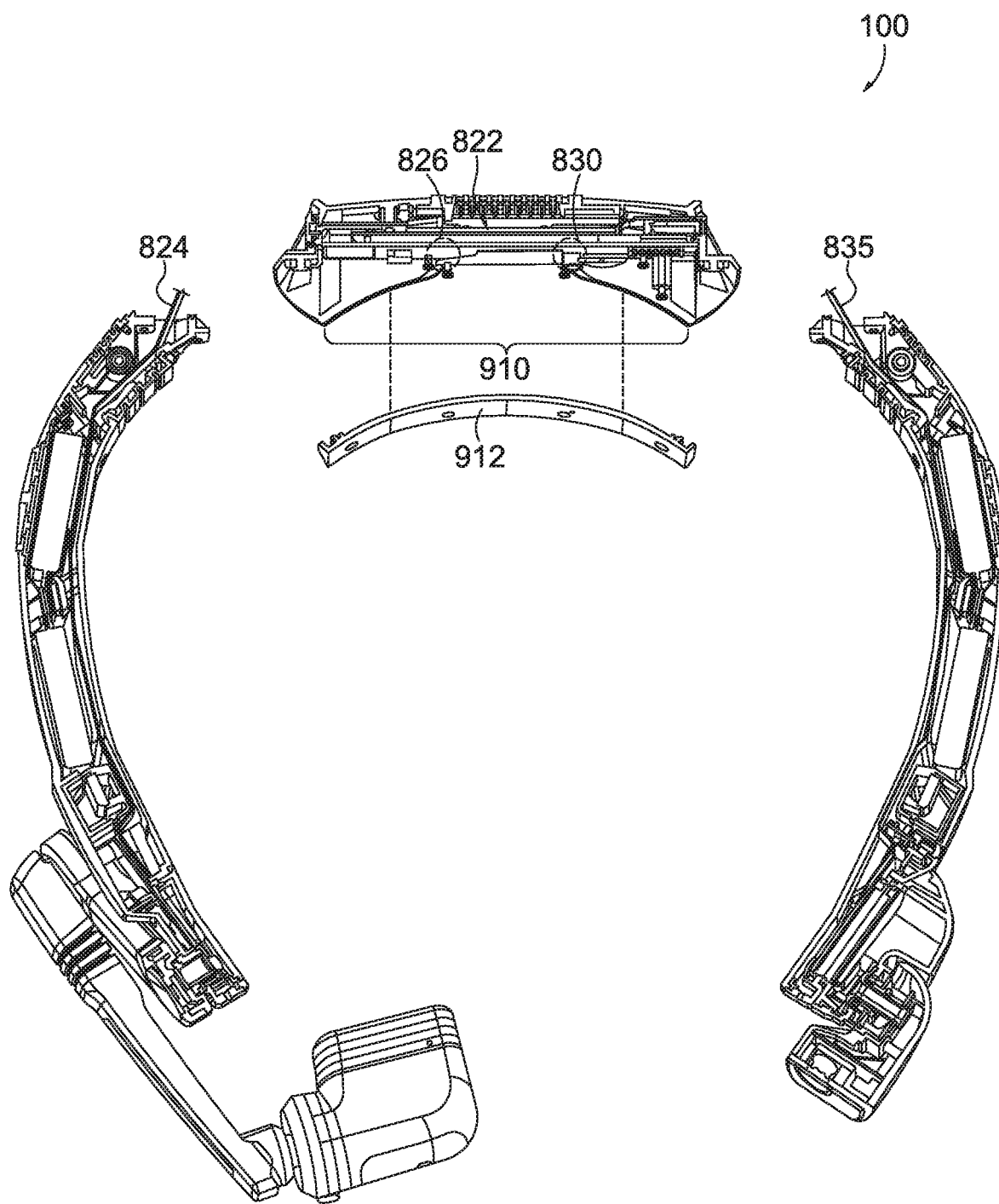
FIG. 9 illustrates an exploded view of FIG. 8, illustrating one or more access ports on a base member of the head-mounted display system of FIGS. 1A-B, in accordance with embodiments of the present technology.

Turning to FIG. 9, an exploded view of the head-mounted display system 100 of FIG. 1A is provided, illustrating the wires 824, 835 decoupled from the battery monitor 822. As described herein, the arm members 114, 119 and base member 112 of the head-mounted display system 100 may be modular components. The modularity of the head-mounted display system 100 allows the members (e.g., the first arm member 114, the second arm member 119, and the base member 112) and their electrical components to be manufactured and assembled separately. Additionally, the modularity of the members and their respective electrical components allows them to be individually tested prior to the final assembly of the overall head-mounted display system 100, ensuring that the electrical components within each member functions properly before the head-mounted display system 100 is finally assembled.

As illustrated, the first arm member 114 and the second arm member 119 may be mechanically coupled to (or de-coupled from) the base member 112. For instance, as described with respect to FIG. 4A, the first arm member 114 may be mechanically coupled to the base member 112 via the hinge system 310 using one or more attachment mechanisms 420, 422. The second arm member 119 may be mechanically coupled to the base member 112 in the same manner.

The electrical components within the first arm member 114 and the second arm member 119 may be electrically coupled to (or de-coupled from) the electrical components of the base member 112. To electrically couple the electrical components, the base member 112 has a service port 910 (or a plurality of service ports) having a service port cover 912 (or a plurality of service port covers) that is removably coupled from the base member 112. The service port 910 is an opening defined by one or more exterior walls of the base member 112, allowing access to the first monitor terminal 826 and/or second monitor terminal 830. The service port 910 allows a technician to quickly couple (or decouple) the first wires 824 and/or the second wires 835 to the battery monitor 822.

The service port cover 912 may be removably coupled to the base member 112. When the service port cover 912 is coupled to the base member 112, it may enclose the service port 910, preventing external elements from entering the interior of the frame. The service port cover 912 may be removably coupled to the base member 112 via one or more attachment mechanisms, such as one or more of screw-based elements, male-female connectors, straps, clips, buttons, hooks, hook-and-loop fasteners, or the like.

FIG. 10 illustrates an exemplary computing device 1000 that may be mounted to the head-mounted display system 100. Computing device 1000 includes a bus 1010 that directly or indirectly couples the following devices: memory 1012, one or more processors 1014, one or more presentation components 1016, input/output (I/O) ports 1018, input/output (I/O) components 1020, and an illustrative power supply 1022. Bus 1010 represents what may be one or more busses (such as an address bus, data bus, or combination thereof). Although the various blocks of FIG. 10 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventor recognizes that such is the nature of the art, and reiterates that the diagram of FIG. 10 is merely illustrative of an exemplary computing device that can be used in connection with one or more embodiments of the present invention. Distinction is not made between such categories as "workstation," "server," "laptop," "handheld device," etc., as all are contemplated within the scope of FIG. 10 and reference to "computing device."

Computing device 1000 typically includes a variety of computer-readable media. Computer-readable media can be any available media that can be accessed by computing device 1000 and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, layout structures, program modules, or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 1000. Computer storage media does not comprise signals per se. Communication media typically embodies computer-readable instructions, layout structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media.

Memory 1012 includes computer storage media in the form of volatile and/or nonvolatile memory. The memory may be removable, non-removable, or a combination thereof. Exemplary hardware devices include solid-state memory, hard drives, optical-disc drives, etc. Computing device 1000 includes one or more processors 1014 that read data from various entities such as memory 1012 or I/O components 1020. Presentation component(s) 1016 present data indications to a user or other device. Exemplary presentation components include a display device, speaker, printing component, vibrating component, etc.

I/O ports 1018 allow computing device 1000 to be logically coupled to other devices including I/O components 1020, some of which may be built in. Illustrative components include a microphone, joystick, game pad, satellite dish, scanner, printer, wireless device, etc. The I/O components 1020 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 1000. The computing device 1000 may be equipped with depth cameras, such as stereoscopic camera systems, infrared camera systems, RGB camera systems, touchscreen technology, and combinations of these, for gesture detection and recognition. Additionally, the computing device 1000 may be equipped with accelerometers or gyroscopes that enable detection of motion. The output of the accelerometers or gyroscopes may be provided to the display of the computing device 1000 to render immersive augmented reality or virtual reality.

Figure 11:
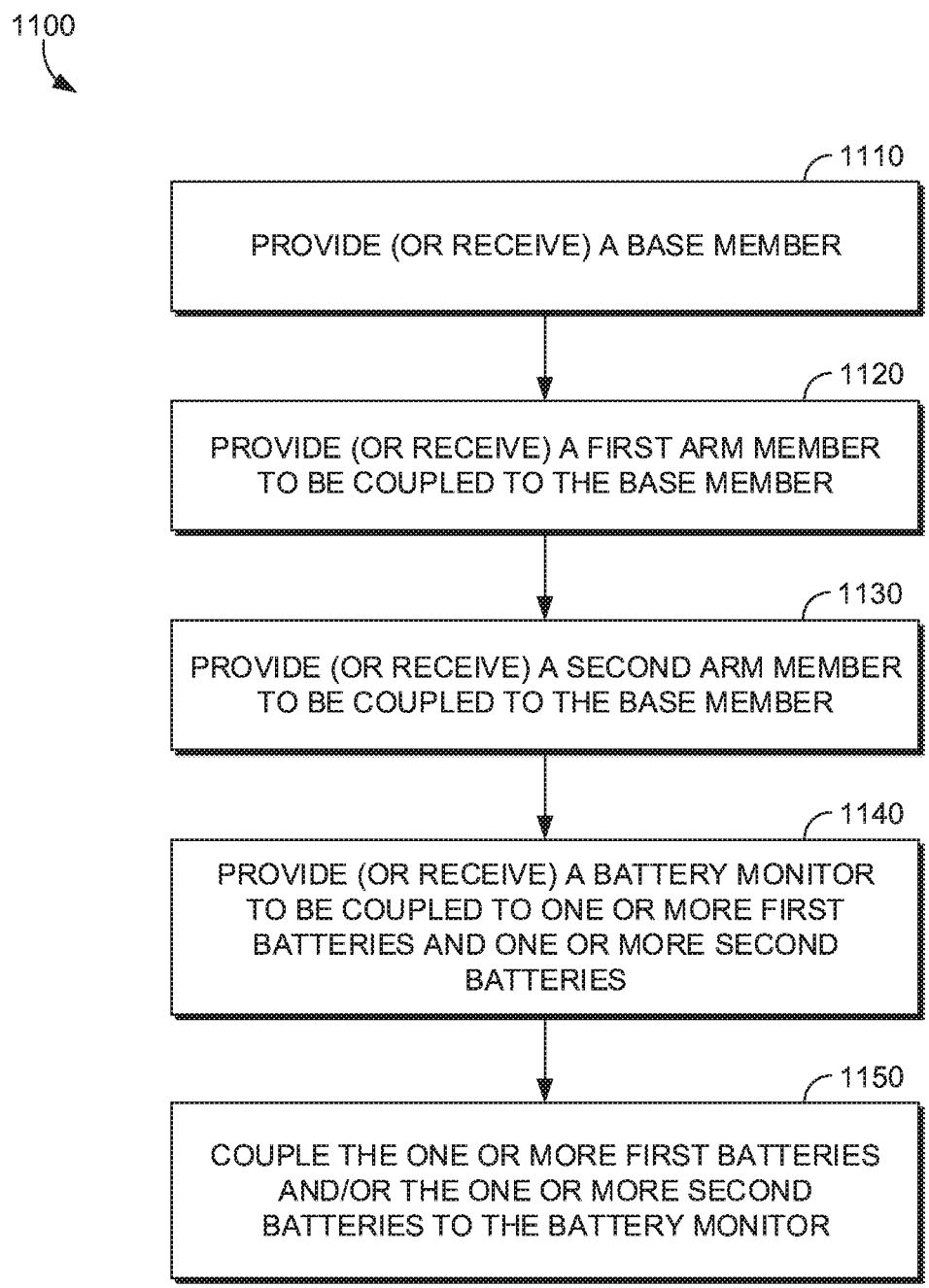
FIG. 11 a flow diagram of an exemplary method of assembling a head-mounted display system, in accordance with embodiments of the present technology.

FIG. 11 is a flow diagram 1100 of an exemplary method of assembling a head-mounted display system, such as head-mounted display system 100, in accordance with embodiments of the present technology. At block 1110, a base member (e.g., base member 112) having a first end and a second end is provided (or received), the base member having one or more interior walls that define one or more chambers within the base member. At block 1120, a first arm member (e.g., first arm member 114) is provided (or received), where the first arm member is to be coupled to the first end of the base member at a proximal end. The first arm member has one or more interior walls defining a first chamber, and the first chamber having a first opening at the proximal end of the first arm member.

At block 1130, a second arm member (e.g., second arm member 119) is provided (or received), where the second arm member is to be coupled to the second end of the base member. The second member is spaced apart from the first arm member to form an opening therebetween so as to be worn on a wearer's head. The second arm member has one or more interior walls defining a second chamber, and the second chamber having a second opening at the proximal end of the second arm member. The first arm member and the second arm member are coupled to the base member via one or more hinges positioned at the proximal end of the first arm member and the second arm member. The one or more hinges allow a distal end of the first arm member and a distal end of the second arm member to move with respect to one another. In some aspects, one or more first batteries are positioned in the first chamber of the first arm member, and one or more second batteries are positioned in the second chamber of the second arm member.

At block 1140, a battery monitor (e.g., battery monitor 822) is provided (or received), the battery monitor is positioned within the one or more chambers of the base member and between the one or more first batteries and the one or more second batteries, for example, as described in greater detail with respect to FIG. 8. The battery monitor manages a charge or load of the one or more first batteries and the one or more second batteries.

At block 1150, the battery monitor is electrically coupled to the one or more first batteries via a first wiring extending through the first opening and through the one or more hinges (e.g., one or more hinges 110). The battery monitor may further be electrically coupled to the one or more second batteries via a second wiring extending through the second opening and through the one or more hinges. While not shown, the method may further include mechanically coupling the first arm member and/or the second arm member to the base member, for example, as described in greater detail with respect to FIG. 7.

Among other advantages, aspects described herein provide a head-mounted display that has a modular design having greater flexibility and weight distribution of batteries. Typically, head-mounted display systems demand a large amount power and are often ill-fitting or cumbersome. The head-mounted display system provided herein satisfies the power demands while still remaining comfortable to wear based on the weight distribution of the batteries and other electrical components. Additionally, the head-mounted display system is less prone to falling off the wearer's head or being caught by objects in the user's surroundings based on having the wiring extend internally throughout one or more members and having a slim profile.

Should the head-mounted display system be accidentally dropped, the head-mounted display system may provide improved impact resistance via one or more hinges. For instance, the head-mounted display system may be worn during activities where the user rotates her head, such as in sports or fixing difficult-to-reach machinery in industrial environments. The head-mounted display may be accidently dropped during these activities. The hinges allow the arms to move with respect to the base member so that the frame can better absorb or distribute the impact force. In some aspects, a tensioning element may be provided in the hinge to further dampen the impact force.

As mentioned, the head-mounted display system may be a modular system, where the arm members and base member and their respective electrical components may be coupled or decoupled so as to swap out a particular component. To facilitate the coupling and decoupling, aspects may include one or more service ports that give a technician access electrical connections within the base member and/or arm member. The modularity and service ports of the head-mounted display system improve manufacturing and assembly of the head-mounted display system. For example, the arm members and the base member may be manufactured and tested separately, such as at different factories or at different times of the manufacturing processes, and then assembled together at a later time. Further, in the event that a component of the head-mounted display system breaks (e.g., an arm member, base member, or hinge) or if its electrical components malfunction, the component can be swapped out for a new component without replacing the entire frame.

Auxiliary Battery System

Figure 12:
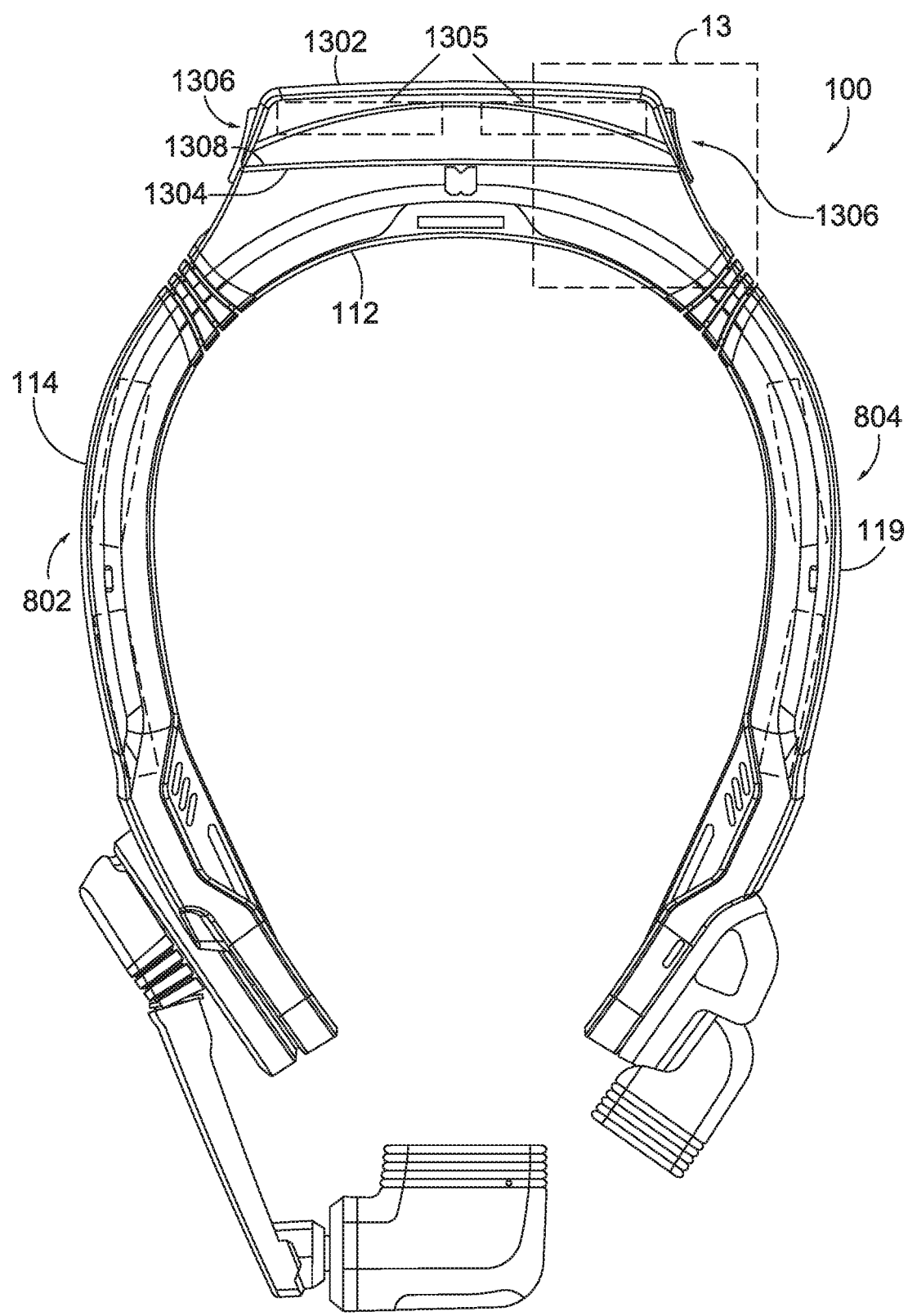
FIG. 12 illustrates an auxiliary battery coupled to a base member of the head-mounted display system of FIGS. 1A-B, in accordance with embodiments of the present technology.

FIG. 12 illustrates an auxiliary battery 1302 coupled to the base member 112 of the head-mounted display system 100 of FIG. 8, in accordance with embodiments of the present technology. The head-mounted display system 100 includes the first arm member 114 and the second arm member 119. The first and second arm member 114, 119 has one or more interior walls defining the first and second chamber 216, 217, respectively. The one or more batteries 802, 804 are positioned within a first and second chamber, such as the first and second arm chamber 216, 217 of FIG. 8. The one or more batteries 802, 804 provide a power source to the electrical components of the head-mounted display system 100.

To increase the capacity of the power source available to the head-mounted display system 100, auxiliary battery 1302 may be coupled to the head-mounted display system 100. Specifically, the auxiliary battery 1302 may be coupled to the base member 112. For example, a first side 1308 of the auxiliary battery 1302 may mate with an exterior surface 1304 of the base member 112. The auxiliary battery 1302 may be an auxiliary attachment that includes one or more auxiliary batteries 1305 positioned within a chamber formed by one or more interior walls of the auxiliary attachment.

Figure 13:
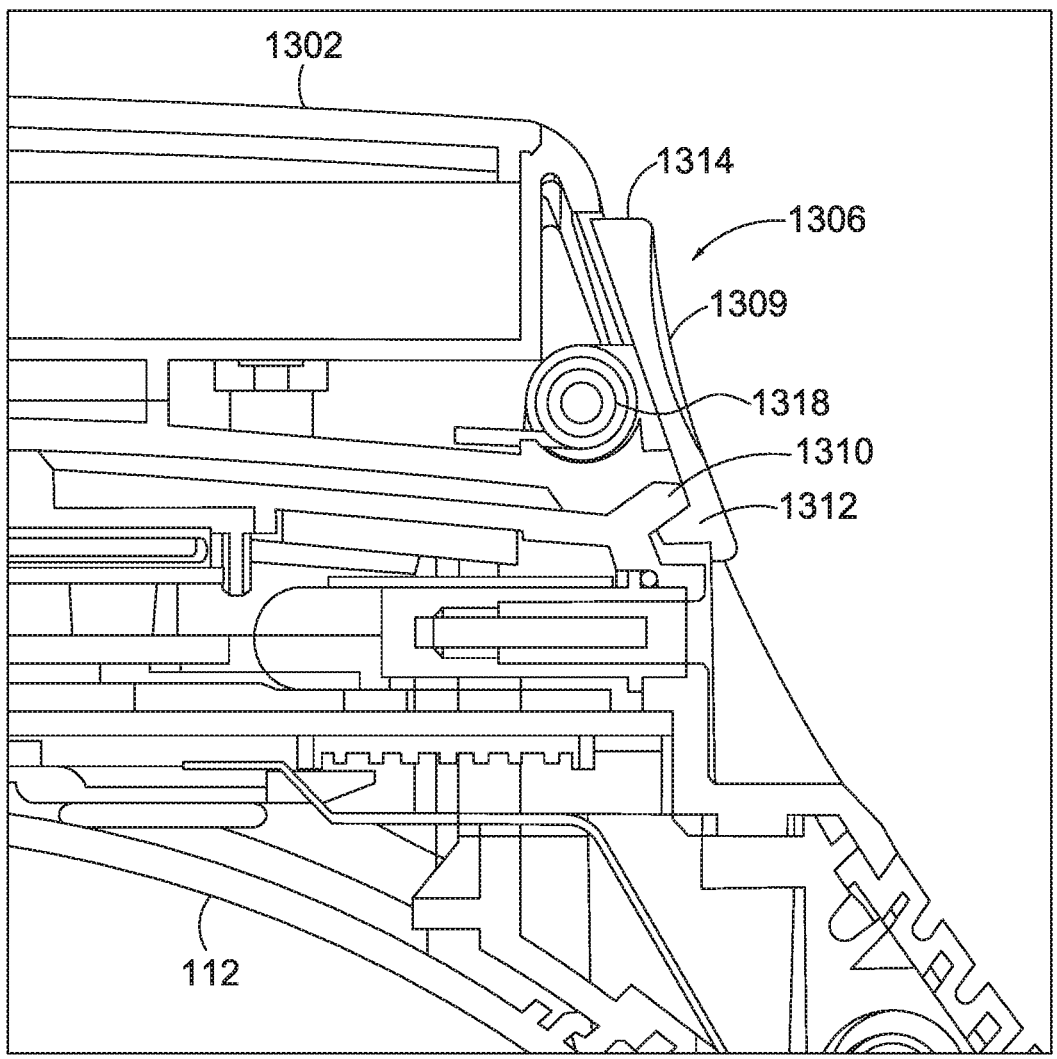
FIG. 13 illustrates an enlarged view of area 13 in FIG. 12, showing an enlarged view a fastener coupling the auxiliary battery to the base member of FIG. 13, in accordance with embodiments of the present technology.

As better illustrated in FIG. 13, the auxiliary battery 1302 may be removably coupled to the base member 112 via one or more fasteners 1306, thereby securing the auxiliary battery 1302 to the head-mounted display system 100. As illustrated in FIG. 12, the auxiliary battery 1302 couples to the base member 112 via at least two fasteners 1306. For instance, the at least two fasteners 1306 may be positioned at different points along the exterior surface 1304 of the base member 112. Fastener(s) 1306 secures the auxiliary battery 1302 to the base member 112 so as to maintain an uninterrupted electrical connection between the auxiliary battery 1302 and the base member 112, as discussed in greater detail with respect to FIGS. 14-15. As mentioned, the head-mounted display system 100 may be worn while the user is in difficult-to-reach areas, while trying to repair machinery. Utilizing at least two fasteners 1306 ensures that the auxiliary battery 1302 is secured to the head-mounted display system 100 as the wearer moves his or her head to perform repairs.

The charge and/or load of the auxiliary battery 1302 is monitored by a battery monitor, such as battery monitor 822 of FIG. 8. The battery monitor 822 may utilize the one or more auxiliary batteries 1305 to charge the one or more batteries 802, 804 and/or satisfy a load created by the head-mounted display system 100. Additionally or alternatively, the battery monitor 822 may utilize the one or more auxiliary batteries 1305 in specific circumstances, such as when there is a peak in the load or when a particular power-hungry component is activated (e.g., a 5G modem). Accordingly, in some aspects, the one or more auxiliary batteries 1305 may be employed to satisfy a unique load created by a specific component of the head-mounted display system 100.

FIG. 13 illustrates an enlarged view of area 13 in FIG. 12, showing an enlarged view of the fastener 1306 coupling the auxiliary battery 1302 to the base member 112 of FIG. 12, in accordance with embodiments of the present technology. The fastener 1306 may be any component that is configured to removably couple the auxiliary battery 1302 to the head-mounted display system 100. By way of example and not limitation, the fastener 1306 may be a clamp, clip, latch, button, magnet, hook and loop, or the like. While power connectors 1320, 1520 are discussed in greater detail below, the fastener 1306 may be distinct from the power connectors 1320, 1520. For instance, the fastener 1306 may be offset from the power connectors 1320, 1520.

In some aspects, the fastener 1306 may include a movable member 1309 that catches a receiving member 1310. The movable member 1309 and the receiving member 1310 may facilitate a quick-release (or quick coupling) of the auxiliary battery 1302 to the base member 112. The movable member 1309 may be movably attached to the auxiliary battery 1302. For instance the movable member 1309 may slide, rotate, or pivot with respect to the auxiliary battery 1302 so as to engage and/or disengage from the receiving mechanism 1310. An end of the movable member 1309 may include a lip 1312 that catches the receiving mechanism 1310. The receiving mechanism 1310 may be any opening, groove, protrusion, or lip that engages the movable member 1309.

The fastener 1306 may include a biasing element 1318 that biases the movable member 1309 to engage the receiving mechanism 1310. In some aspects, the biasing element 1318 may be a torsional spring. To decouple the auxiliary battery 1302, a second end 1314 of the movable member 1309 may be pressed, causing the movable member 1309 to move. The movement of the movable member 1309 allows the lip 1312 to disengage from the receiving mechanism 1310. It should be appreciated that while FIG. 12 illustrates the movable member 1309 as being located on the auxiliary battery 1302 and the receiving mechanism 1310 as being located on the base member 112, different arrangements are contemplated. For instance, the movable member 1309 may be located on the base member 112 and the receiving mechanism 1310 is located on the auxiliary battery 1302.

Figure 14:
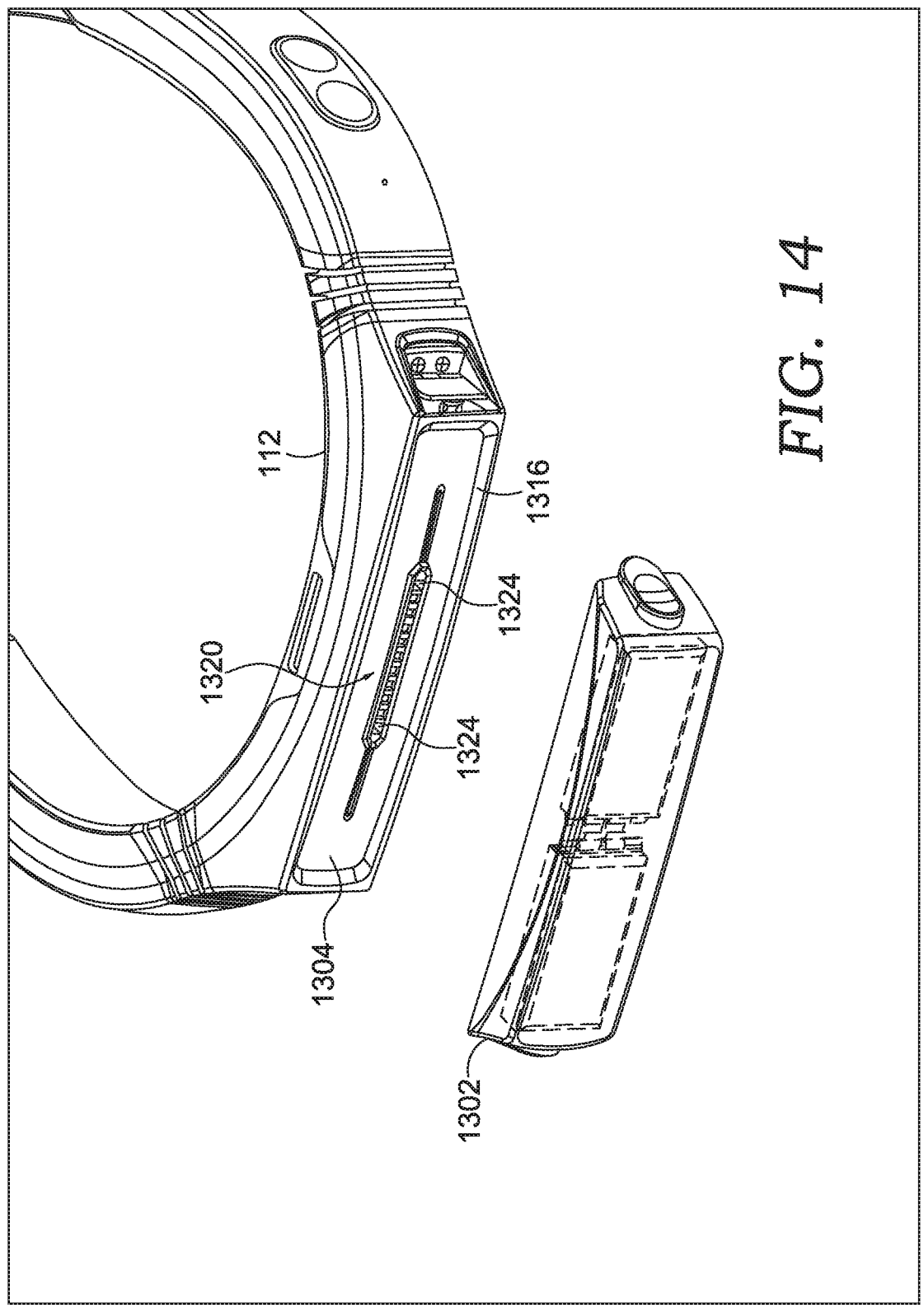
FIG. 14 is a first perspective of an exploded view of the auxiliary battery decoupled from the base member of the head-mounted display system of FIG. 12, in accordance with embodiments of the present technology.

FIG. 14 is a first perspective of an exploded view of the auxiliary battery 1302 decoupled from the base member 112 of head-mounted display system 100 of FIG. 12, in accordance with embodiments of the present technology. The exterior surface 1304 of the base member 112 may comprise one or more guiding mechanisms (e.g., beveled edges 1316 or recesses 1324) to guide the auxiliary battery 1302 into place. It should be appreciated that, when the head-mounted display system 100 is in an as-worn configuration, the base member 112 may correspond to the back of a wearer's head. To prevent the wearer from taking the head-mounted display system 100 off to couple the auxiliary battery 1302, the one or more guiding mechanisms allows the wearer to quickly attach the auxiliary battery 1302.

The one or more guiding mechanisms of the base member 112 may have one or more corresponding guiding mechanisms on the surface of the auxiliary battery 1302. The guiding mechanisms and corresponding guiding mechanism may be any corresponding recess and protrusions, corresponding pins and recesses, corresponding concave and convex surfaces, corresponding arcuate or angled surfaces. Additionally, the corresponding guiding mechanism may be located on any portion of the base member 112 and/or the auxiliary battery 1302.

Figure 15:
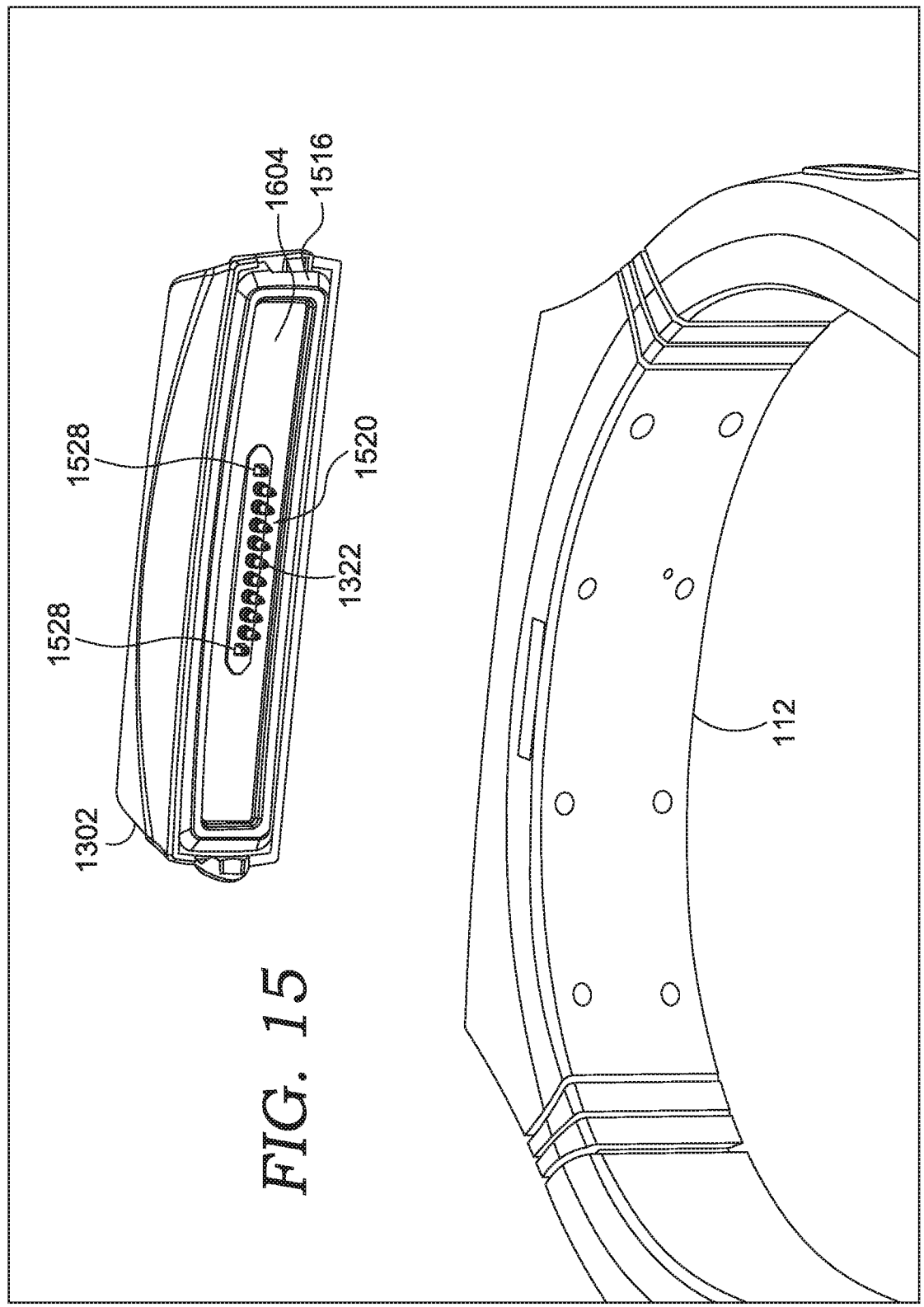
FIG. 15 is a second perspective of an exploded view of the auxiliary battery decoupled from the head-mounted display system of FIG. 12, in accordance with embodiments of the present technology.

As illustrated, a first guiding mechanism includes the beveled edge 1316. Additionally, the beveled edge 1316 may extend at least partially around the exterior surface 1304. The beveled edge 1316 may surround the entirety of an area containing a power connector (e.g., power connectors 1320, 1520) so as to secure the power connectors in place. Turning briefly to FIG. 15, the beveled edge 1316 of the base component 112 may correspond to the beveled edge 1516 of the auxiliary battery 1302. When a user couples the auxiliary battery 1302 to the head-mounted display system 100, the corresponding beveled edges 1316, 1516 assist in guiding the auxiliary battery 1302 into place.

A second guiding mechanism includes one or more recesses 1324. The recesses 1324 can be slots, opening, indentations, grooves, or the like in the exterior surface 1304 of the base member 112 that receive corresponding protrusions. FIG. 15 illustrates protrusions 1528 that extend beyond a surface of auxiliary battery 1302. The protrusions 1528 may be received in the recesses 1324 so as to guide the auxiliary battery 1302 into position as the wearer mounts the auxiliary battery 1302 to the head-mounted display system 100. While the recesses 1324 are illustrated as part of the auxiliary battery 1302 and the recesses 1324 are illustrated as being part of the base member 112, other configurations are contemplated. For instance, the recesses 1324 may be part of the auxiliary battery 1302 and the protrusions 1528 may be part of the base member 112.

Referring to both FIGS. 14-15, the auxiliary battery 1302 and the base member 112 include power connectors 1320, 1520 that align when the auxiliary battery 1302 is mounted to the base member 112. The power connectors 1320, 1520 may be any corresponding power connectors that electrically couple the auxiliary battery 1302 to the head-mounted display system 100. In some aspects, the power connectors 1320, 1520 electrically couple the auxiliary battery 1302 to the battery monitor 822.

The power connectors 1320, 1520 may include a pin connector and corresponding terminal surface. In some aspects, the terminal surface may be a substantially flat surface. As illustrated, the power connector 1320 includes a terminal surface (e.g., a mating surface) that contacts pins positioned on the auxiliary battery 1302. Additionally or alternatively, the terminal surface may be recessed from a surface of the base member 112 to preserve the integrity of the surface when the auxiliary battery 1302 is not coupled to the head-mounted display system 100. Additionally or alternatively, while the terminal surface is shown as being substantially perpendicular to the exterior surface 1304, it is contemplated that the terminal surface may be angled and/or substantially perpendicular to the exterior surface 1304.

To facilitate the ease of coupling/decoupling of the auxiliary battery 1302, the power connector 1520 may be a spring-loaded pin or pogo pin connector. The spring-loaded pin may be a plunger tip that moves with respect to a barrel of the pin. A force is applied to the plunger tip to keep the plunger tip at an upper end of the barrel of the pin. For instance, a helical spring may force the plunger tip toward the upper end of the barrel. The force applied to the plunger tip may push the plunger tip toward a terminal surface when the auxiliary battery 1302 is mounted to base member 112. When mounted, the terminal surface may oppose the plunger tip, thereby causing the plunger time to move toward a lower end of the barrel of the pin. The spring-loaded pin may ensure continuous contact between power connectors 1320, 1520 when the auxiliary battery 1302 is mounted to the base member 112. As mentioned, the head-mounted display system 100 may be worn during strenuous activities, so the auxiliary battery 1302 may be vulnerable to decoupling or becoming dislodged, thereby interrupting the electrical communication. The fastener 1306 may ensure that the power connectors 1320, 1520 remain electrically coupled.

As better illustrated in FIG. 15, the power connector 1520 is a 9-pin connector. The 9-pin connector may include an ID pin 1322 that provides an indication of whether the auxiliary battery 1302 is a battery or an auxiliary attachment that electrically couples to an AC power source. It should be appreciated that the battery monitor 822 may manage the charge and/or load differently based on whether the battery ID pin 1322 indicates that the attachment is drawing power from a limited power source (e.g., a battery) or whether the attachment is drawing power from an unlimited power source, such as from a wall outlet. The 9-pin connector may further include 4 pins for drawing power, two data (SDA) pins, and two clock (SCL) pins.

It should be appreciated that a guiding mechanism may be positioned proximate the power connectors 1320, 1520 to not only guide the auxiliary attachment into place but to also protect the power connectors from being damaged. As illustrated in FIGS. 14-15, the one or more recesses 1324 and one or more protrusions 1528 are positioned proximate the power connectors 1320, 1520. Positioning the guiding mechanism proximate the power connectors 1320, 1520 prevents the pin from being damaged if a force strikes the auxiliary battery 1302, such as a force that is perpendicular to a surface of the base member 112 or the auxiliary battery 1302. Additionally or alternatively, positioning the guiding mechanism proximate the power connectors 1320, 1520 ensures proper alignment of the power connectors 1320, 1520 as the user mounts the auxiliary battery 1302.

In some aspects, the one or more recesses 1324 and one or more protrusions 1528 may be offset from the power connectors 1320, 1520. For example, the one or more recesses 1324 and one or more protrusions 1528 may be offset from the power connectors 1320, 1520 up to about five inches. As another example, the guiding mechanism may be offset from the power connectors 1320, 1520 up to three inches. As a further example, the one or more recesses 1324 and one or more protrusions 1528 may be offset from the power connectors 1320, 1520 from a range of about 0.1 inches to about five inches. As an additional example, the one or more recesses 1324 and one or more protrusions 1528 may be offset from the power connectors 1320, 1520 from a range of about 0.1 inches to about three inches.

Figure 16:
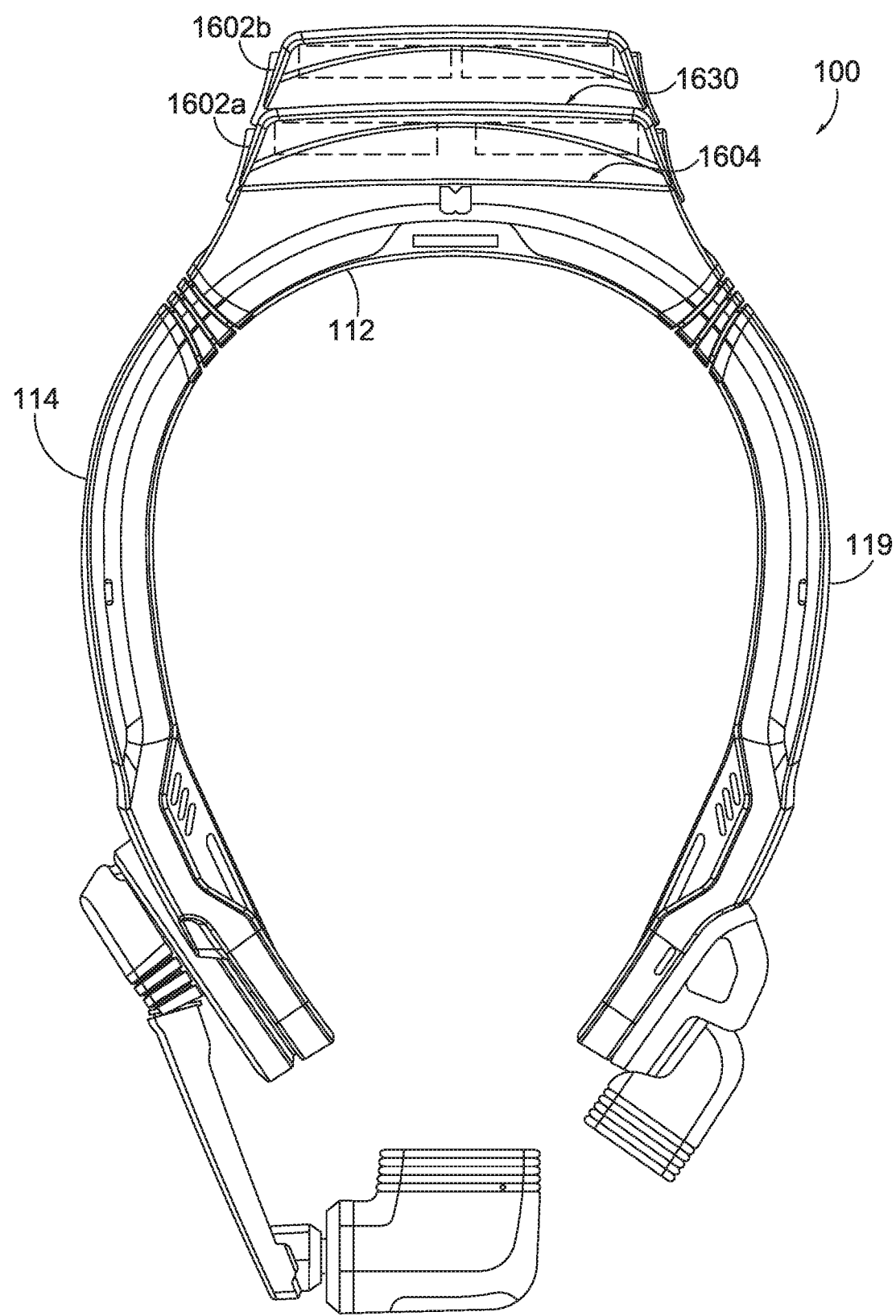
FIG. 16 is an assembled view of a plurality of auxiliary batteries coupled to the head-mounted display system of FIG. 12, in accordance with embodiments of the present technology.
Figure 17:
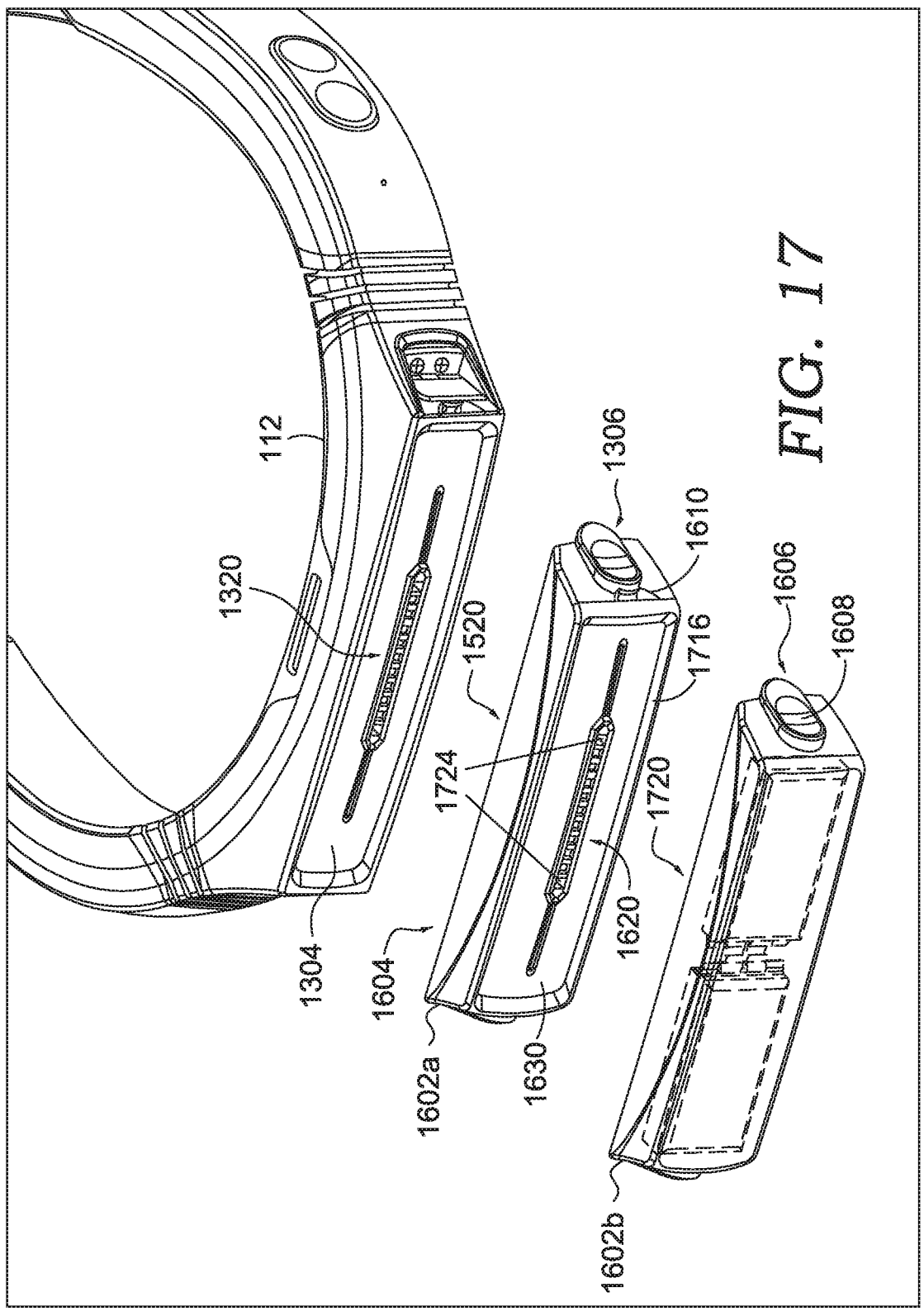
FIG. 17 is an exploded view of the plurality of auxiliary batteries decoupled from the head-mounted display system of FIG. 12, in accordance with embodiments of the present technology.

FIGS. 16-17 are an assembled and exploded view of a plurality of auxiliary batteries 1602*a-b* coupled to the head-mounted display system 100 of FIG. 12, in accordance with embodiments of the present technology. The plurality of auxiliary batteries 1602*a-b* may be stack mounted to the head-mounted display system 100. For example, a first auxiliary battery 1602*a* may be coupled to the base member 112. A second auxiliary battery 1602*b* can then be coupled to the first auxiliary battery 1602*a*. Both the first and second auxiliary batteries 1602*a-b* can supply power to the head-mounted display system 100. Accordingly, the second auxiliary battery 1602*b* further increases the power capacity of the head-mounted display system 100, which may be required to operate the head-mounted display system 100 for extended periods of time.

As better illustrated in FIG. 17, the first auxiliary battery 1602*a* has a first side 1604 and a second side 1630. The first auxiliary battery 1602*a* mechanically and electrically couples to the base member 112, as explained in greater detail with respect to FIGS. 12-15. For instance, the first side 1604 mates with the exterior surface 1304 of the base member 112.

The first auxiliary battery 1602*a* includes a first power connector 1520 (obscured from view) that electrically couples to a power connector 1320 of the base member 112. The first power connector 1520 may also be referred to as a first auxiliary power connector 1520. The first auxiliary battery 1602*a* also includes the fastener 1306 that mechanically couples the first auxiliary battery 1602*a* to the base member 112.

The second side 1630 of the first auxiliary battery 1602*a* includes a second power connector 1620 (also referred to as a second auxiliary power connector 1620) that aligns with a third power connector 1720 (obscured from view), which is also referred to as a third auxiliary power connector 1720, of the second auxiliary battery 1602*b*. The second power connector 1620 may be similar to the power connector 1320 of the base member 112 and the third power connector 1720 may be similar to the power connector 1520. Because power connectors 1320, 1520 are described in greater detail with respect to FIGS. 12-15, the second power connector 1620 and the third power connector 1720 are not described in detail here.

Additionally or alternatively, the second side 1630 may mate to a surface of the second auxiliary battery 1602*b*, similar to how to the base member 112 mates to the first auxiliary battery 1302 of FIGS. 14-15, including via one or more corresponding guiding mechanisms, such as one or more corresponding beveled edges and/or corresponding pin and recesses described in greater detail above. The one or more beveled edges 1716 and/or recesses 1724 are similar to the corresponding beveled edges 1316, 1516 and/or corresponding protrusions 1528 and recesses 1324. As such, the one or more beveled edges 1716 and/or recesses 1724 are not described in further detail here.

As illustrated, the second auxiliary battery 1602*b* can be coupled to the first auxiliary battery 1602*a*. The second auxiliary battery 1602*b* may mechanically couple to the first auxiliary battery 1602*a* in a similar manner that the first auxiliary battery 1602*a* couples to the base member 112. For example, the second auxiliary battery 1602*b* couples to the first auxiliary battery 1602*a* via a fastener 1606. The fastener 1606 may be a clamp, clip, latch, button, magnet, hook and loop, or the like.

The fastener 1606 may be similar to fastener 1306. For instance, the fastener 1606 includes a movable member 1608. The movable member 1608 may be positioned on the second auxiliary battery 1602*b* and engages (and/or disengages) a receiving mechanism 1610 on the first auxiliary battery 1602*a*. It is contemplated that the movable member 1608 may be positioned on the first auxiliary battery 1602*a* and the receiving mechanism 1610 is positioned on the second auxiliary battery 1602*b*. Because fastener 1606 can be similar to fastener 1306, further details of fastener 1606 are not described here and can be found with respect to the fastener 1306 of FIG. 12. Additionally or alternatively, the fastener 1606 may be distinct from power connectors 1620, 1720. For instance, the fastener 1606 may be offset from the power connectors 1520, 1620, similar to how fastener 1306 is offset from power connectors 1320, 1520.

While not illustrated, the head-mounted display system 100 may include an auxiliary attachment that couples to an AC power source. The auxiliary attachment may couple to the exterior surface 1304 of the base member 112 and/or the second side 1630 of the first auxiliary battery 1602*a*. It should be appreciated that the auxiliary attachment may take a similar form and have similar mechanical and/or electrical features as the first and second auxiliary batteries 1302, 1702. The auxiliary attachment that couples to an AC power source may therefore mechanically and electrically couple to the base member 112, the first auxiliary battery 1602*a*, and/or the second auxiliary battery 1602*a* in a similar manner that is described herein.

By way of example, the auxiliary attachment may take the position of the first auxiliary battery 1602*a* in FIGS. 16-17. As such, the auxiliary attachment may couple (electrically and mechanically) to the base member 112 at a first side and couple to the second auxiliary battery 1602*b* at a second side, similar to how the first auxiliary battery 1602*a* couples to the base member 112 and the second auxiliary battery 1602b. Additionally or alternatively, the auxiliary attachment may take the position of the second auxiliary battery 1602b in FIGS. 16-17. As such, the auxiliary attachment may couple (electrically and mechanically) to the second side 1630 of the first auxiliary battery 1602a, similar to how the second auxiliary battery 1602b couples to the first auxiliary battery 1602a.

More specifically, the auxiliary attachment may mechanically couple to the base member 112, the first auxiliary battery 1602a, and/or the second auxiliary battery 1602a via a fastener. The auxiliary attachment fastener may be similar to fasteners 1306, 1606. The auxiliary attachment may also electrically couple to the base member 112, the first auxiliary battery 1602a, and/or the second auxiliary battery 1602b via one or more auxiliary attachment power connectors. The one or more auxiliary attachment power connectors may be similar to the power connectors described herein (e.g., base member power connector 1320 or power connectors 1520, 1620, 1720). The one or more third auxiliary attachments may provide an unlimited power source via the auxiliary attachment power connectors. The ID pin, such as ID pin 1322, may provide an indication that the auxiliary attachment is not a battery and/or is capable of providing an unlimited power source, such as from an AC power outlet. The auxiliary attachment may include a wired connection to the AC power outlet.

Figure 18:
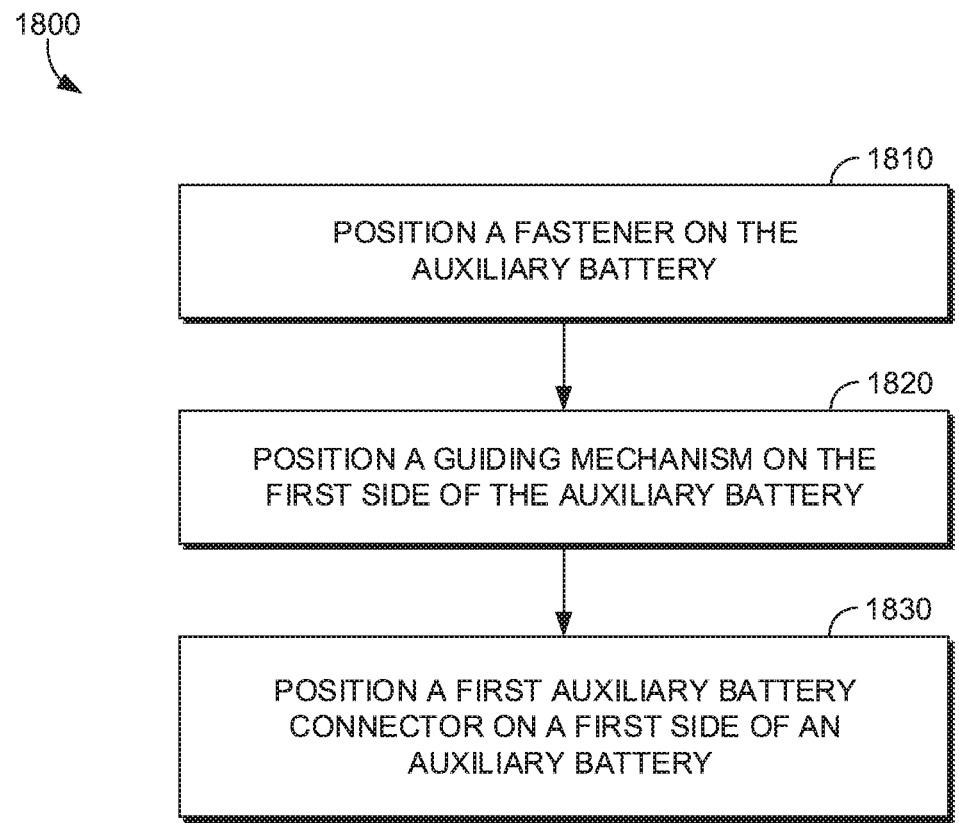
FIG. 18 is a flow diagram of an exemplary method of manufacturing an auxiliary battery for a head-mounted display system of FIG. 12, in accordance with embodiments of the present technology.

FIG. 18 is a flow diagram 1800 of an exemplary method of manufacturing an auxiliary battery, such as auxiliary battery 1302, for a head-mounted display system, such as head-mounted display system 100, in accordance with embodiments of the present technology. At block 1810, a fastener, such as fastener 1306, is positioned on the auxiliary battery. The fastener may be positioned so as to align with a corresponding fastener on a base member, such as base member 112. For example, the fastener may include a movable member (e.g., the movable member 1309) that engages with a receiving mechanism of the base member, such as the receiving mechanism 1310 of base member 112. Further details of the fastener are described in reference to FIGS. 12-14.

While not shown, the flow diagram 1800 may further include positioning a second fastener to couple the auxiliary battery to another auxiliary battery, such as the second auxiliary battery 1602b. For example, a receiving mechanism may be formed in the auxiliary battery so as to receive a movable member from another auxiliary battery. Further details of the second fastener are described in reference to FIGS. 12-14 and 16-17.

At block 1820, one or more guiding mechanisms may be positioned on the auxiliary battery. In some aspects, a guiding mechanism is positioned on a first side (e.g., the first side 1604) of the auxiliary battery. The guiding mechanism may be positioned to align with a corresponding guiding mechanism positioned on the base member. For example, the auxiliary battery may have a beveled edge (e.g., the beveled edge 1516) that aligns with a beveled edge (e.g., the beveled edge 1316) on the base member. As a further example, the auxiliary battery may have a protrusion (e.g., the protrusion 1528) that aligns with a recess (e.g., the recess 1324) of the base member. In some aspects, the protrusion may be proximate to the first auxiliary battery connector, as described herein. Further details regarding the one or more guiding mechanism are provided with respect to FIGS. 14-17.

In some aspects, a guiding mechanism is positioned on a second side of the auxiliary battery, such as second side 1630. The guiding mechanism may be positioned to align with a corresponding guiding mechanism positioned on the second auxiliary battery and/or an auxiliary attachment that is coupled to an AC power source. For example, the auxiliary battery may have a beveled edge (e.g., one or more beveled edges 1716) that aligns with a beveled edge on the second auxiliary battery. As a further example, the auxiliary battery may have a recess (e.g., recesses 1724) that aligns with a protrusion of the second auxiliary battery. In some aspects, the protrusion and/or recess may be positioned proximate to the first auxiliary battery connector, as described herein. Further details regarding the one or more guiding mechanisms are provided with respect to FIGS. 14-17.

At block 1830, a first auxiliary battery power connector, such as the first battery power connector 1520, is positioned on the first side of an auxiliary battery. The first auxiliary battery power connector is positioned so as to align with a power connector of a base member, such as the power connector 1320. In some aspects, the first auxiliary battery power connector includes a spring-loaded pin that is configured to contact a terminal plate of the power connector of the base member, as described herein. In some aspects, the first auxiliary battery includes one or more guiding mechanisms proximate to the first auxiliary battery power connector, such as the protrusion 1528 described in greater detail with reference to FIGS. 14-15.

While not shown, the flow diagram 1800 may further include positioning a second auxiliary battery power connector, such as power connector 1620, on a second side of the first auxiliary battery. The second auxiliary battery power connector may electrically couple the auxiliary battery to another auxiliary battery, such as the second auxiliary battery 1602b. Further details of the second auxiliary battery power connector are described in reference to FIGS. 16-17.

Aspects of the present disclosure have been described with the intent to be illustrative rather than restrictive. Alternative aspects will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all steps listed in the various figures need be carried out in the specific order described.

What is claimed is:

1. A battery system for a head-mounted display system comprising:
 a first arm member having one or more interior walls defining a first chamber, wherein one or more first batteries are positioned in the first chamber of the first arm member;
 a second arm member having one or more interior walls defining a second chamber, wherein one or more second batteries are positioned in the second chamber of the second arm member;
 a display member coupled to the first arm member at a first end of the first arm member;
 a base member coupled to each of the first arm member and the second arm member at a second end of the first arm member and the second arm member, the base member having a base member power connector positioned along an exterior surface; and a first auxiliary battery that removably couples to the exterior surface of the base member via a first fastener, the first auxiliary battery having a first side and a second side, wherein a first auxiliary battery power connector is positioned on the first side and aligns with the base member power connector.

2. The battery system of claim 1, wherein the first auxiliary battery has a second auxiliary power connector positioned on the second side.

3. The battery system of claim 2, further comprising a second auxiliary battery that removably couples to the second side the first auxiliary battery, the second auxiliary battery having a third auxiliary power interface that aligns with the second auxiliary power connector of the second auxiliary battery.

4. The battery system of claim 1, further comprising an auxiliary attachment that supplies AC power.

5. The battery system of claim 4, wherein the auxiliary attachment removably couples to at least one of the first auxiliary battery power connector or the base member power connector via a second fastener.

6. The battery system of claim 1, wherein the first fastener is offset from the first auxiliary battery power connector.

7. The battery system of claim 1, further comprising a corresponding protrusion and recess positioned on the base member and the first auxiliary battery, wherein the corresponding protrusion and recess is offset from the base member power connector and the first auxiliary battery power connector.

8. The battery system of claim 7, wherein the corresponding protrusion and recess is offset from the first auxiliary battery power connector up to about five inches.

9. A battery system for a head-mounted display system comprising:
   one or more arm members having one or more interior walls defining a first chamber and a second chamber;
   one or more batteries positioned in the first chamber and the second chamber;
   one or more display members that couples to a first end of the one or more arm members; and
   a base member that couples to each of the one or more arm members at a second end of the one or more arm members, the base member having a base member power connector on an exterior surface;
   a first auxiliary battery having a first side and a second side;
   a first fastener that removably couples the first side of the auxiliary battery to the exterior surface of the base member; and
   a first auxiliary battery power connector on the first side of the first auxiliary battery, the first auxiliary battery power connector electrically coupling to the base member power connector, and wherein the first fastener is offset from the first auxiliary battery power connector and the base member power connector.

10. The battery system of claim 9, wherein the first auxiliary battery has a second auxiliary power connector positioned on the second side.

11. The battery system of claim 10, further comprising a second auxiliary battery that removably couples to the second side the first auxiliary battery via a second fastener, the second auxiliary battery having a third auxiliary power interface that aligns with the second auxiliary power connector of the second auxiliary battery.

12. The battery system of claim 9, wherein the base member power connector and the first auxiliary battery power connector comprise: a spring-loaded pin and a terminal surface.

13. The battery system of claim 12, wherein the spring-loaded pin is positioned on the first auxiliary battery power connector and the terminal surface is positioned on the base member power connector.

14. The battery system of claim 9, further comprising an auxiliary attachment that supplies AC power via a third auxiliary attachment power connector, the auxiliary attachment removably couples to at least one of the first auxiliary battery or the base member via a third fastener that is offset from the third auxiliary attachment power connector.

15. The battery system of claim 14, wherein the first fastener comprises a movable member that engages with a receiving mechanism positioned on the base member or the first auxiliary battery.

16. A method of manufacturing an auxiliary battery for a head-mounted display system comprising:
   positioning one or more fasteners on a first auxiliary battery that removably couples to an exterior surface of a base member, the first auxiliary battery having a first side and a second side;
   positioning one or more guiding mechanisms on the first side of the auxiliary battery, the one or more guiding mechanisms aligning with one or more guiding mechanisms of the base member;
   positioning a first auxiliary battery power connector on the first side of the first auxiliary battery, the first auxiliary battery power connector aligning with a base member power connector; and
   positioning a second auxiliary battery power connector on the second side of the first auxiliary battery, the second auxiliary battery power connector aligning with a third power connector of a second auxiliary battery.

17. The method of claim 16, wherein the one or more fasteners are offset from the first auxiliary battery power connector.

18. The method of claim 17, wherein the one or more fasteners comprise a movable member that engages with a receiving mechanism of the base member.

19. The method of claim 16, wherein the first auxiliary battery power connector comprises a spring-loaded pin.

20. The method of claim 16, wherein the one or more guiding mechanisms are offset from the first auxiliary battery power connector.

* * * * *